US011226251B2

United States Patent
Zhang et al.

(10) Patent No.: US 11,226,251 B2
(45) Date of Patent: Jan. 18, 2022

(54) METHOD OF MAKING A DUAL-CAVITY PRESSURE SENSOR DIE

(71) Applicant: Chinese Academy of Sciences Institute of Geology and Geophysics, Beijing (CN)

(72) Inventors: Yiming Zhang, Beijing (CN); Fan Zeng, Beijing (CN); Man Wong, Hong Kong (CN); Kevin Chau, Beijing (CN)

(73) Assignee: Chinese Academy of Sciences Institute of Geology and Geophysics, Beijing (CN)

( * ) Notice: Subject to any disclaimer, the term of this patent is extended or adjusted under 35 U.S.C. 154(b) by 0 days.

(21) Appl. No.: 17/023,734

(22) Filed: Sep. 17, 2020

(65) Prior Publication Data

US 2021/0003468 A1    Jan. 7, 2021

Related U.S. Application Data

(62) Division of application No. 16/308,802, filed as application No. PCT/CN2017/000359 on May 16, 2017, now Pat. No. 10,809,141.

(30) Foreign Application Priority Data

Jun. 14, 2016  (CN) .......................... 201610412814.5

(51) Int. Cl.
| | | |
|---|---|---|
| *G01L 9/06* | (2006.01) | |
| *G01L 9/00* | (2006.01) | |
| *H01L 21/02* | (2006.01) | |
| *H01L 21/28* | (2006.01) | |
| *H01L 21/3115* | (2006.01) | |
| *H01L 21/3213* | (2006.01) | |
| *H01L 21/50* | (2006.01) | |

(Continued)

(52) U.S. Cl.
CPC .............. *G01L 9/065* (2013.01); *G01L 9/008* (2013.01); *G01L 9/0054* (2013.01); *H01L 21/02126* (2013.01); *H01L 21/28167* (2013.01); *H01L 21/31155* (2013.01); *H01L 21/32133* (2013.01); *H01L 21/50* (2013.01); *H01L 21/76251* (2013.01); *H01L 23/5228* (2013.01); *B81B 2201/0264* (2013.01)

(58) Field of Classification Search
None
See application file for complete search history.

(56) References Cited

U.S. PATENT DOCUMENTS

2018/0275000 A1* 9/2018 Chau ....................... G01B 7/16

\* cited by examiner

*Primary Examiner* — Hsien Ming Lee
(74) *Attorney, Agent, or Firm* — Edwin A. Sisson, Attorney at Law, LLC; Jeffrey J. Banyas

(57) ABSTRACT

A pressure sensor die especially suitable for high-temperature, high-pressure operating environment and delivering accurate and reliable pressure measurement at low cost. A single crystalline silicon includes a cap, a substrate and a base connected together. A recess formed on the cap creates an upper sealed cavity with the substrate. A silicon oxide layer is formed between the substrate and the cap. A recess formed on the base creates a lower sealed cavity with the substrate. The upper sealed cavity and the lower sealed cavity overlap in their projections. The substrate includes at least two sets of piezoresistive sensing elements located within the overlapping projections, perpendicular to each other, and oriented in different crystallographic directions.

8 Claims, 30 Drawing Sheets

Step 5

Step 6

(51) Int. Cl.
*H01L 21/762* (2006.01)
*H01L 23/522* (2006.01)

Step 1

Step 2

Step 3

Step 4

Step 5

Step 6

Step 7

Step 8

Step 9

Step 1

Step 2

Step 3

Step 4

Step 5

Step 6

Step 7

Step 8

Step 9

Step 1

Step 2

Step 3

Step 4

Step 5

Step 6

Step 7

Step 8

Step 9

Step 1

Step 2

Step 3

Step 4

Step 5

Step 6

Step 7

Step 8

Step 9

METHOD OF MAKING A DUAL-CAVITY PRESSURE SENSOR DIE

The present invention is related to a sensor. In particular, the present invention relates to a pressure sensor for downhole pressure measurements.

BACKGROUND OF THE INVENTION

Downhole pressure measurements are essential when drilling for hydrocarbon recovery. During the drilling process, geological pressure data are collected to tailor drilling parameters and the construction of the well. After the well is drilled and production starts, pressure is continuously monitored for reservoir management. Accurate measurement of pressure is therefore the key to optimize recovery and reduce risk throughout the entire life of a hydrocarbon well. Thus, we need an accurate and cost-effective pressure sensor for downhole measurements.

Pressure sensors usable in hydrocarbon wells must be able to withstand harsh conditions and remain accurate, stable and reliable for weeks during a measurement period. In particular, such sensors must be able to withstand temperature ranging from −50° C. to 250° C. and pressure up to 200 MPa (around 2000 atmospheres) while maintaining an accuracy of better than 0.1%, and desirably 0.01%, of the full-scale pressure.

Two types of pressure sensors are commonly used for downhole applications. The first type is the resonant quartz pressure sensor. In U.S. Pat. No. 3,617,780, one example of resonant quartz pressure sensor is described wherein a crystalline quartz cylinder closed at both ends is immersed in a fluid which communicates with the external pressure to be measured via an isolation diaphragm or a bellow. A crystalline quartz plate spans across the vacuum sealed cavity inside the cylinder. The plate resonance is excited and detected via the piezoelectric effect. The plate resonant frequency, which varies with the hydrostatic pressure on the cylinder wall, is a measure of the external pressure. Constructed almost entirely out of crystalline quartz and being a mature technology, resonant quartz pressure sensors have achieved the highest benchmark for accuracy, stability and reliability for downhole pressure measurements to date. However, they tend to be very expensive.

The second type of downhole pressure sensors is based on sapphire. In U.S. Pat. No. 5,024,098, a sapphire pressure sensor is described wherein a sapphire cell is immersed in a fluid which communicates with the external pressure to be measured via an isolation diaphragm. The cell deforms under pressure and the resulting strains are measured by strain gauge elements disposed on a planar surface of the sapphire cell. While reliable and rugged for downhole applications, sapphire pressure sensors are in general not as stable and accurate as resonant quartz pressure sensors and they are also quite expensive. In case silicon strain gauge elements are employed, accuracy and stability could be affected by the excessive temperature coefficient of resistance and the temperature coefficient of piezoresistance effect in silicon. On the other hand, if non-silicon strain gauge elements, for example, metallic alloys, are used their low gauge factor and therefore low sensitivity can result in the undesirable amplification of temperature and other measurement errors. In any case, the mismatch in the thermal expansion coefficients between sapphire and the strain gauge material creates further temperature errors.

The majority of sensors in use today are of the micro-electro-mechanical system (MEMS) type. MEMS based sensors are typically realized with silicon micromachining that originated from integrated circuit fabrication and still shares many of its processing technologies. In addition, there are a few unique processes specifically tailored toward the fabrication of 3-dimensional microstructures. These include double-side photolithography, deep reactive ion etching (DRIE), and wafer bonding to name a few. Silicon has superb mechanical properties compared with quartz and sapphire, for example, high hardness, high modulus of elasticity, high ultimate strength, and is perfectly elastic up to the fracture point. Moreover, single crystalline silicon is highly piezoresistive, which is therefore effective in converting changes in mechanical strain into changes in electrical resistance. Furthermore, precision microstructures are much easier to fabricate in silicon than in quartz or sapphire. With demonstrated advantages that include low cost, small size, high accuracy, high reliability, and high stability, silicon MEMS piezoresistive pressure sensors have become the dominant type of pressure sensors in use for automotive, medical, industrial and consumer electronics applications.

Despite their huge success, MEMS pressure sensors have not been widely adopted for downhole applications. There are a few problems that must be overcome. In particular, an improved mechanical design over the conventional diaphragm-type silicon pressure sensors is required to handle the very high pressure. This is because in a conventional diaphragm-type silicon pressure sensor die, the silicon thin diaphragm serves the purpose of amplifying pressure into stress. In order to measure high pressure up to 200 MPa, the lateral dimensions and thickness of the diaphragm must be respectively narrowed down and thickened accordingly. However, if the lateral dimensions of the diaphragm are made too narrow, there will not be enough room on the diaphragm to place the piezoresistive sensing elements. Else if the diaphragm is thickened substantially, it will lead to non-ideal deformation of the entire pressure sensor die. Furthermore, the piezoresistive sensing elements in conventional MEMS pressure sensors are located on the pressure sensor die surface where they are more vulnerable to external environmental influence. Besides, there needs to be a better means to overcome the various temperature coefficients and instabilities so as to improve the measurement accuracy at high temperature. Accordingly, a need presently exists for an improved silicon pressure sensor that is highly accurate, cost effective, and suitable for operating in a high temperature, high pressure downhole environment.

SUMMARY OF THE INVENTION

The objective of the present invention is to overcome current technological shortcomings so as to provide a pressure sensor that is highly accurate, having a wide pressure range, less affected by the environment, and capable of operating in a high temperature, high pressure downhole environment.

A pressure sensor die comprising:

a cap, a substrate and a base bonded together; said pressure sensor die is constructed of single crystalline silicon;

wherein a recess is formed on said cap, said recess formed on said cap bonds with said substrate and forms an upper sealed cavity; another recess is formed on said base, said recess formed on said base bonds with said substrate and forms a lower sealed cavity; said substrate is positioned between said upper and lower sealed cavities and partitions said upper and lower sealed cavities;

a silicon oxide layer is formed between said substrate and said cap;

said upper sealed cavity and said lower sealed cavity overlap in their projections;

said substrate further comprises at least two sets of piezoresistive sensing elements; said piezoresistive sensing elements are located within the projections of said upper sealed cavity and said lower sealed cavity; said two sets of piezoresistive sensing elements are perpendicular to each other, with each set of piezoresistive sensing elements oriented in a different crystallographic direction.

The pressure sensor die in the present invention also comprises the following additional features:

Said upper sealed cavity and said lower sealed cavity are vacuum sealed cavities.

Metal contacts are provided at the terminals of said piezoresistive sensing element.

Said piezoresistive sensing element comprises a plurality of connected U-shaped segments.

Said piezoresistive sensing elements are electrically connected in a Wheatstone bridge configuration.

Said substrate is formed on a {110} crystallographic plane of p-type silicon; said piezoresistive sensing elements are formed on n-type doped regions of said substrate; one set of said piezoresistive sensing elements is oriented along a <100> crystallographic direction, and the other set of said piezoresistive sensing elements is oriented along a <110> crystallographic direction.

Said substrate is formed on a {110} crystallographic plane of n-type silicon; said piezoresistive sensing elements are formed on p-type doped regions of said substrate; one set of said piezoresistive sensing elements is oriented along a <100> crystallographic direction, and the other set of said piezoresistive sensing elements is oriented along a <110> crystallographic direction.

Said substrate of said pressure sensor die uses a silicon-on-insulator construction comprising:

a handle layer, a device layer, and a buried silicon oxide layer formed between said handle layer and device layer;

said piezoresistive sensing elements are formed on said device layer.

A silicon oxide insulating layer is formed on the top, the bottom and along the sides of said piezoresistive sensing element.

Said device layer is formed on a {110} crystallographic plane of p-type silicon; said piezoresistive sensing elements are formed on said p-type silicon of said device layer; one set of said piezoresistive sensing elements is oriented along a <100> crystallographic direction, and the other set of said piezoresistive sensing elements is oriented along a <110> crystallographic direction.

Said device layer is formed on a {110} crystallographic plane of n-type silicon; said piezoresistive sensing elements are formed on said n-type silicon of said device layer; one set of said piezoresistive sensing elements is oriented along a <100> crystallographic direction, and the other set of said piezoresistive sensing elements is oriented along a <110> crystallographic direction.

A pressure sensor comprising:

a chamber, an electrically insulating fluid that fills said chamber, and said pressure sensor die provided within said chamber;

said chamber is an enclosure within a metal housing;

said pressure sensor die is immersed in said electrically insulating fluid.

A metal diaphragm is further provided in said pressure sensor; said metal diaphragm is connected to said chamber; said metal diaphragm seals said electrically insulating fluid and said pressure sensor die in said chamber; and external pressure to be measured is transmitted from said metal diaphragm to said pressure sensor die.

The first fabrication process for the first embodiment of said pressure sensor die;

the starting material for said substrate is a single crystalline silicon wafer;

said fabrication process comprises the following steps:

Step 1, grow or deposit a silicon oxide layer on the top surface of a substrate silicon wafer;

Step 2, using photolithography and ion implantation, dope selective regions on the top surface of said substrate silicon wafer, thus forming a plurality of piezoresistive sensing elements with the opposite dopant type to said substrate silicon wafer;

Step 3, using photolithography and ion implantation, highly dope selective regions on the top surface of said substrate silicon wafer, thus forming highly conductive regions with the opposite dopant type to said substrate silicon wafer;

Step 4, using photolithography and ion implantation, highly dope selective regions on the top surface of said substrate silicon wafer, thus forming highly conductive regions with the same dopant type as said substrate silicon wafer; afterward grow or deposit a silicon oxide layer on the top surface of said substrate silicon wafer, and activate said implanted dopant species in said piezoresistive sensing elements, said highly conductive regions with the opposite dopant type to said substrate silicon wafer, and said highly conductive regions with the same dopant type as said substrate silicon wafer;

Step 5, using photolithography and etching, etch contact holes through said silicon oxide layer over said highly conductive regions with the opposite dopant type to said substrate silicon wafer, and over said highly conductive regions with the same dopant type as said substrate silicon wafer; then use metal deposition to form metal interconnection patterns from said contact holes;

Step 6, bond a cap silicon wafer which has been prefabricated with recesses to the top surface of said substrate silicon wafer;

Step 7, grind and thin down the bottom side of said substrate silicon wafer;

Step 8, bond a base silicon wafer which has been prefabricated with recesses to the bottom surface of said substrate silicon wafer;

Step 9, using wafer dicing, cut said bonded cap, substrate, and base silicon wafers into completed individual pressure sensor dice.

The second fabrication process for the first embodiment of said pressure sensor die;

the starting material for said substrate is a single crystalline silicon wafer;

said fabrication process comprises the following steps:

Step 1, fabricate recesses on the top surface of a base silicon wafer;

Step 2; bond said base silicon wafer to the bottom surface of a substrate silicon wafer; afterward grind and thin down the top side of said substrate silicon wafer;

Step 3, grow or deposit a silicon oxide layer on the top surface of said substrate silicon wafer;

Step 4, using photolithography and ion implantation, dope selective regions on the top surface of said substrate silicon wafer, thus forming a plurality of piezoresistive sensing elements with the opposite dopant type to said substrate silicon wafer;

Step 5, using photolithography and ion implantation, highly dope selective regions on the top surface of said substrate silicon wafer, thus forming highly conductive regions with the opposite dopant type to said substrate silicon wafer;

Step 6, using photolithography and ion implantation, highly dope selective regions on the top surface of said substrate silicon wafer, thus forming highly conductive regions with the same dopant type as said substrate silicon wafer; afterward grow or deposit a silicon oxide layer on the top surface of said substrate silicon wafer, and activate said implanted dopant species in said piezoresistive sensing elements, said highly conductive regions with the opposite dopant type to said substrate silicon wafer, and said highly conductive regions with the same dopant type as said substrate silicon wafer;

Step 7, using photolithography and etching, etch contact holes through said silicon oxide layer over said highly conductive regions with the opposite dopant type to said substrate silicon wafer, and over said highly conductive regions with the same dopant type as said substrate silicon wafer; then use metal deposition to form metal interconnection patterns from said contact holes;

Step 8, bond a cap silicon wafer which has been prefabricated with recesses to the top surface of said substrate silicon wafer;

Step 9, using wafer dicing, cut said bonded cap, substrate, and base silicon wafers into completed individual pressure sensor dice.

The first fabrication process for the second embodiment of said pressure sensor die;

the starting material for said substrate is a silicon-on-insulator wafer comprising a handle layer, a device layer, and a buried silicon oxide layer formed between said handle layer and device layer;

said fabrication process comprises the following steps:

Step 1, grow or deposit a silicon oxide layer on the top surface of said device layer;

Step 2, using photolithography and ion implantation, highly dope selective regions on the top surface of said device layer, thus forming highly conductive regions with the same dopant type as said device layer;

Step 3, using photolithography and etching, etch trenches through said device layer reaching said buried silicon oxide layer, thus forming a plurality of piezoresistive sensing elements;

Step 4, grow or deposit a layer of silicon oxide to fill said trenches, and activate said implanted dopant species in said highly conductive regions;

Step 5, using photolithography and etching, etch contact holes through said silicon oxide layer over said highly conductive regions reaching said highly conductive regions in said device layer; then use metal deposition to form metal interconnection patterns from said contact holes;

Step 6, bond a silicon cap wafer which has been prefabricated with recesses to the top surface of said substrate;

Step 7, grind and thin down the bottom side of said substrate;

Step 8, bond a base silicon wafer which has been prefabricated with recesses to the bottom surface of said substrate;

Step 9, using wafer dicing, cut said bonded cap, substrate, and base silicon wafer into completed individual pressure sensor dice.

The second fabrication process for the second embodiment of said pressure sensor die;

the starting material for said substrate is a silicon-on-insulator wafer comprising a handle layer, a device layer, and a buried silicon oxide layer formed between said handle layer and device layer;

said fabrication process comprises the following steps:

Step 1, fabricate recesses on the top surface of a base silicon wafer;

Step 2, grind and thin down the bottom side of said substrate; afterward bond said base silicon wafer to the bottom surface of said substrate;

Step 3, grow or deposit a silicon oxide layer on the top surface of said device layer on said bonded substrate and base silicon wafer;

Step 4, using photolithography and ion implantation, highly dope selective regions on the top surface of said device layer, thus forming highly conductive regions with the same dopant type as said device layer;

Step 5, using photolithography and etching, etch trenches through said device layer reaching said buried silicon oxide layer, thus forming a plurality of piezoresistive sensing elements;

Step 6, grow or deposit a layer of silicon oxide to fill said trenches, and activate said implanted dopant species in said highly conductive regions;

Step 7, using photolithography and etching, etch contact holes through said silicon oxide layer over said highly conductive regions reaching said highly conductive regions in said device layer; then use metal deposition to form metal interconnection patterns from said contact holes;

Step 8, bond a cap silicon wafer which has been prefabricated with recesses to the top surface of said substrate;

Step 9, using wafer dicing, cut said bonded cap silicon wafer, said substrate, and the base silicon wafer into completed individual pressure sensor dice.

The fabrication process for said recesses on said silicon cap wafer and said base silicon wafer comprises photolithography and etching.

Said etching method comprises one kind or a combination of dry and wet etching methods; said dry etching method is selected from one or more of the following methods: deep reactive ion etching, reactive ion etching, or gaseous xenon difluoride etching for silicon; as well as reactive ion etching, plasma etching, or hydrofluoric acid vapor etching for silicon oxide.

Said wet etching method for silicon comprises one kind or a combination of the following etchants: potassium hydroxide, tetramethylammonium hydroxide, or ethylenediamine pyrocatechol.

Said wet etching method for silicon oxide comprises one kind or a combination of the following etchants: hydrofluoric acid or buffered hydrofluoric acid.

Comparing with the two types of downhole pressure sensors mentioned in the prior art, the pressure sensor in the present invention has the following advantages. First of all, the manufacturing cost of a silicon pressure sensor is much lower than that for quartz and sapphire pressure sensors. However, conventional diaphragm-type silicon pressure sensors cannot function in a 200 MPa environment. In contrast, the pressure sensor die in the present invention does not utilize a diaphragm element as in conventional silicon pressure sensors. Instead, the sensor die is acted upon on all of its surfaces (the top, the bottom and the four sides) by the high pressure in the downhole. The external pressure is directly converted by means of the dual-cavity structure into internal stresses in the substrate of the pressure sensor die without the need for mechanical amplification by a silicon diaphragm. This way the present invention overcomes the main difficulty in the mechanical design of diaphragm-type silicon pressure sensors for high pressure applications while retaining the advantages of silicon MEMS pressure sensors.

Secondly, conventional MEMS piezoresistive sensing elements are electrically insulated by reverse biased PN junctions, the leakage current of which increases exponentially with temperature. As the temperature rises above 150° C., the insulation property of the PN junction will fail. On the other hand, in one of the preferred embodiments of the present invention, there is a buried silicon oxide layer between the piezoresistive sensing elements and the handle layer. There is also silicon oxide layer in between each piezoresistive sensing element. Moreover, a silicon oxide layer is grown or deposited on top of the piezoresistive sensing elements. As a result, each piezoresistive sensing element is completely wrapped around by silicon oxide insulation. Using this dielectric isolation scheme, the electrical insulation will operate even at high temperature.

Furthermore, in the present invention, the two perpendicular sets of piezoresistive sensing elements on the pressure sensor die have different pressure responses, hence providing a differential change in electrical resistance. Then by connecting all four piezoresistive sensing elements in a Wheatstone bridge configuration, temperature and other common mode errors are significantly reduced, thereby increasing the accuracy of the present pressure sensor.

Additionally, the internal cavity formed between the substrate and the cap is preferably sealed in vacuum. The critical portions of all the piezoresistive sensing elements are located inside this vacuum sealed cavity; as a result, these critical portions of the piezoresistive sensing elements are least susceptible to external interferences, such as local temperature fluctuations, and foreign contaminations, such as dust. The reliability of the present pressure sensor is further improved as a result. Lastly, the entire pressure sensor die primarily uses a silicon construction which not only avoids the problems caused by the mismatch between dissimilar materials, but also enables the use of MEMS fabrication technologies with much lower manufacturing cost than that for the quartz and sapphire pressure sensors in the prior art.

DETAILED DESCRIPTION

The illustrative embodiments of the present invention will be described in detail with reference to the accompanying drawings. Please note that the scope of the present invention is not limited to these precise embodiments described. Various changes or modifications may be effected therein by one skilled in the art without departing from the scope or spirit of the invention.

Figure 1:
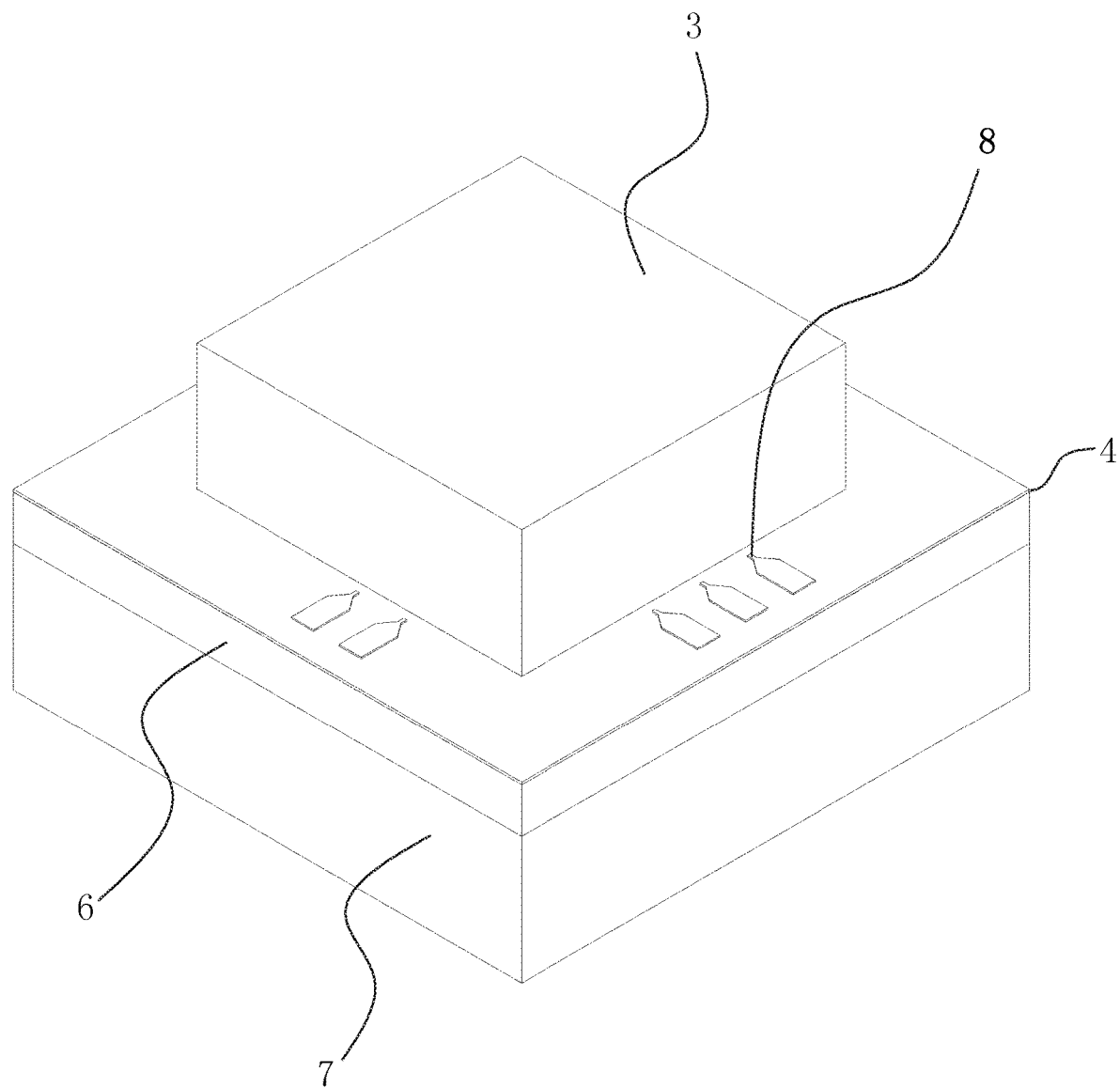
FIG. 1 is a perspective view of the pressure sensor die in the first embodiment of this invention.
Figure 2:
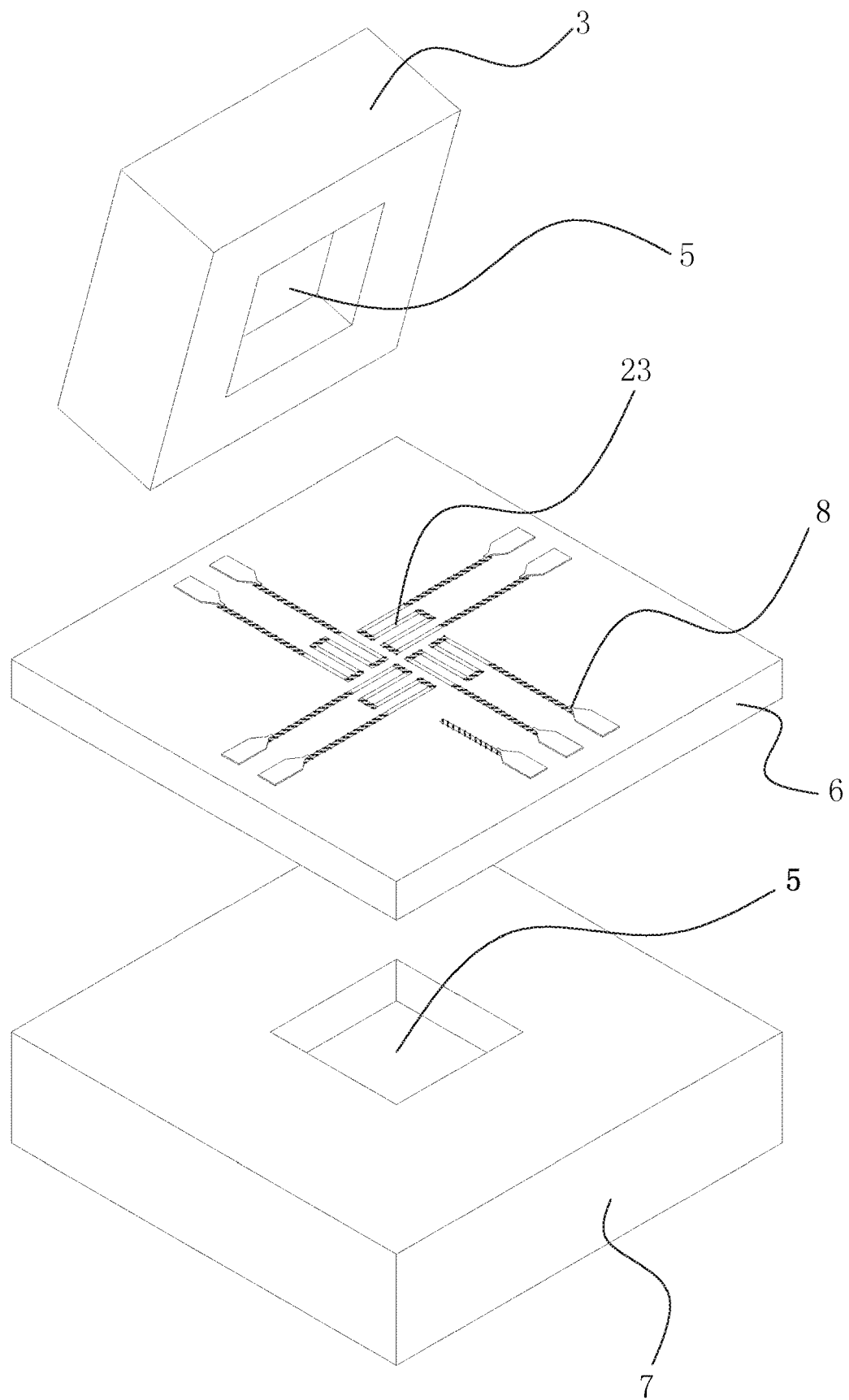
FIG. 2 is a perspective view of the pressure sensor die of FIG. 1 further with the cap and base detached and further with the top silicon oxide layer removed revealing various features on the substrate in the first embodiment of this invention.
Figure 3:
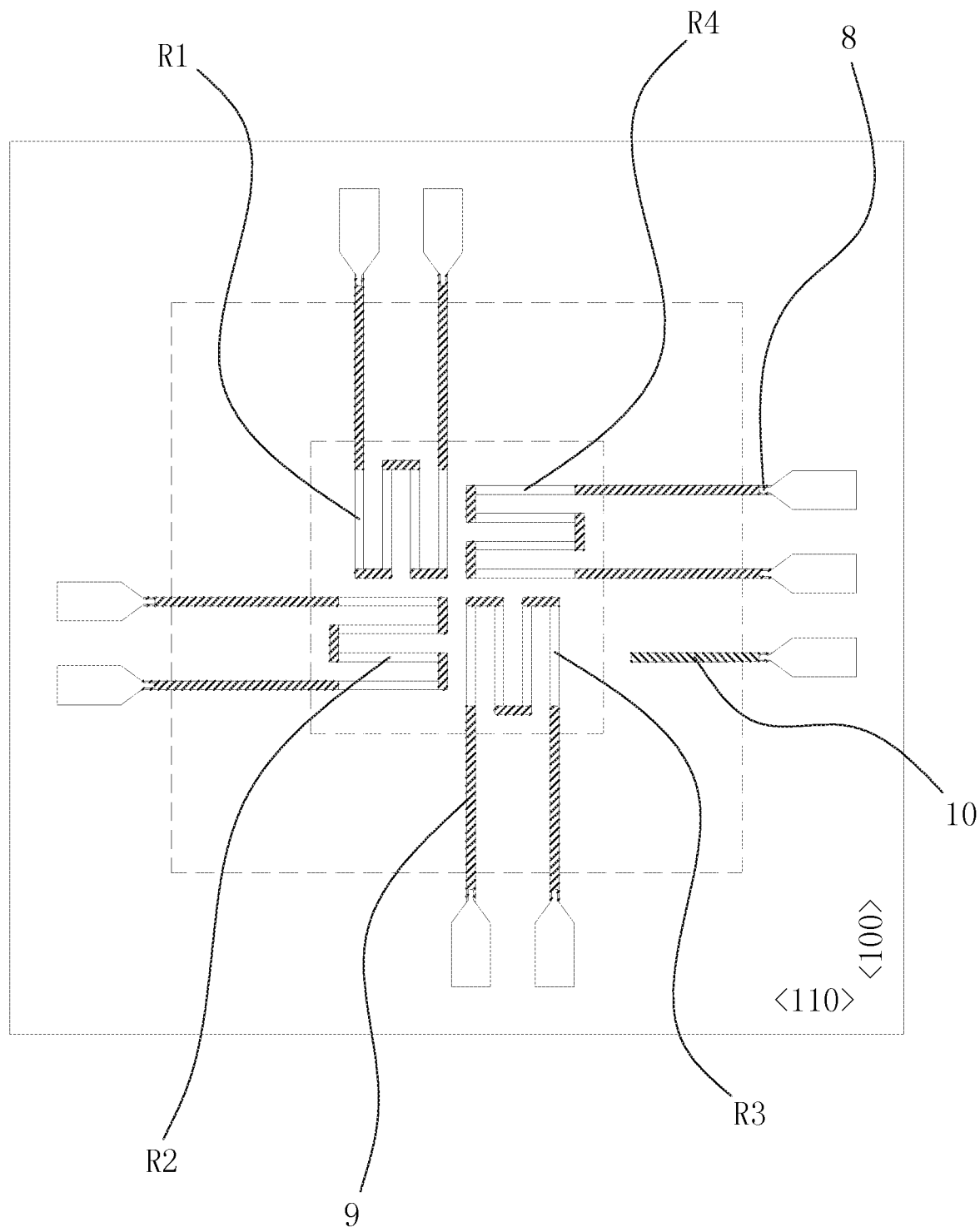
FIG. 3 is a plan view of the pressure sensor die in the first embodiment of this invention.
Figure 4:
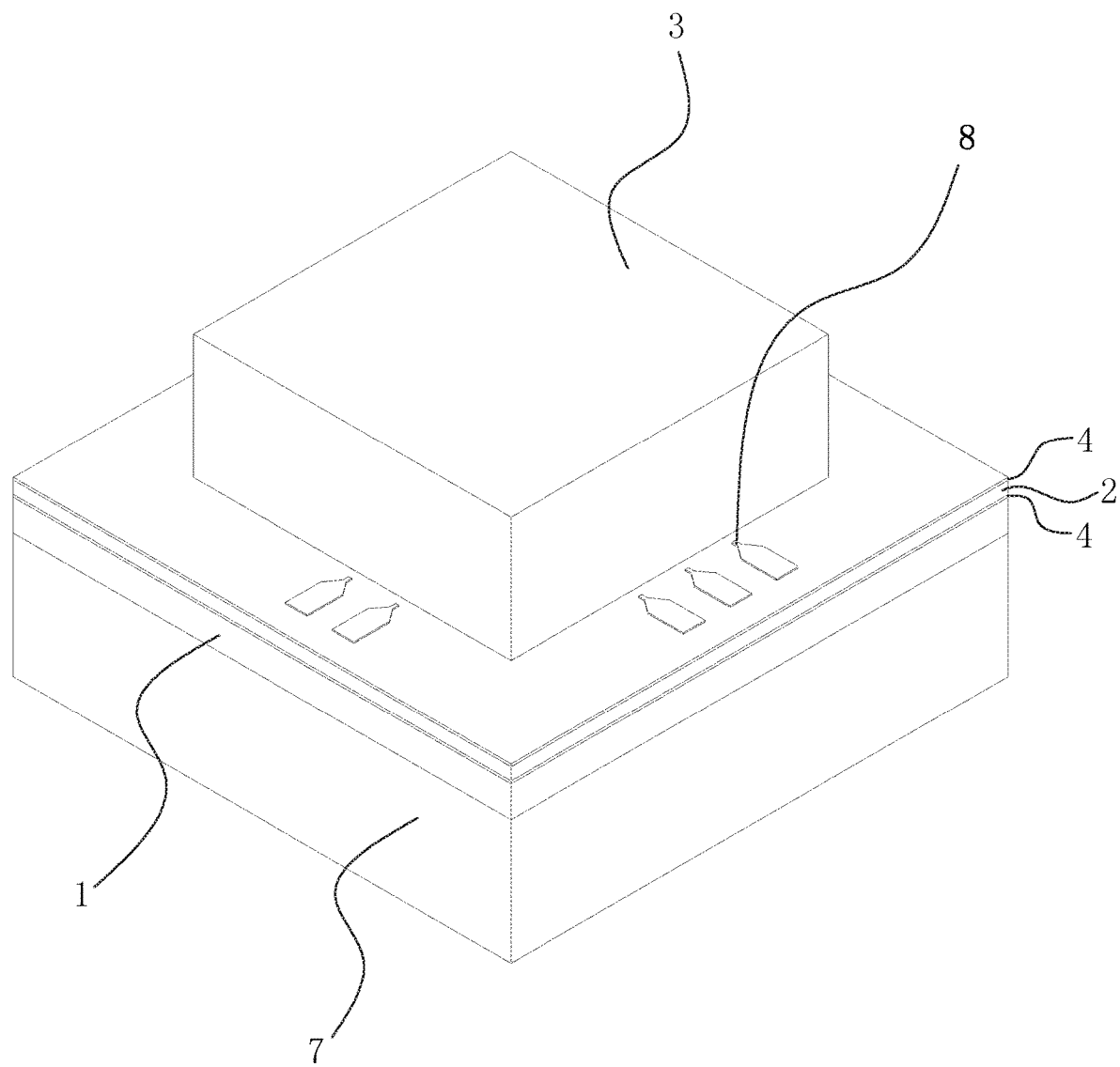
FIG. 4 is a perspective view of the pressure sensor die in the second embodiment of this invention.

With reference to FIGS. 1-3, a pressure sensor die is shown according to the first embodiment of the present invention. The pressure sensor die is primarily constructed of single crystalline silicon and comprises a base 7, a substrate 6 and a cap 3 connected together. Using a silicon construction helps reduce the measurement errors caused by the mismatch in thermal expansion coefficients between dissimilar materials. A recess 5 is formed on the cap 3, which forms an upper sealed cavity after bonding with the substrate 6. Another recess 5 is formed on the base 7, which forms a lower sealed cavity after bonding with the substrate 6. The upper sealed cavity and the lower sealed cavity overlap in their projections. In the plane view shown in FIG. 3, the bonded plane between the cap and the substrate is outlined by the dashed lines. The substrate further comprises a plurality of piezoresistive sensing elements 23. The critical portions of the piezoresistive sensing elements 23 are located inside the upper sealed cavity, and within the boundaries defined by the projections of the upper sealed cavity and the lower sealed cavity. The upper sealed cavity and lower sealed cavity are partitioned by the substrate 6. The two cavities do not communicate with each other. Preferably, the upper sealed cavity and lower sealed cavity are vacuum sealed cavities; this further reduces the undesirable effects of foreign contaminants and local temperature fluctuations on the piezoresistive sensing elements 23. A silicon oxide layer 4 is formed between substrate 6 and cap 3. Metal contacts 8 are provided on top of silicon oxide layer 4. These metal contacts 8 are respectively connected to the terminals of piezoresistive sensing elements 23. External electrical circuits and components are only connected to metal contacts 8; thus it further reduces the effects of undesirable interferences on piezoresistive sensing elements 23.

With reference to FIG. 3, in this first embodiment of the present invention, four identical piezoresistive sensing elements 23 are provided on the substrate 6. These are R1 to R4 in which R1, R3 and R2, R4 are perpendicular to each other. Each piezoresistive sensing element employs a basic U-shaped design. Preferably, the piezoresistive sensing element 23 comprises a few U-shaped segments connected together to form a serpentine structure. In the first embodiment, piezoresistive sensing elements 23 are diffused resistors formed by doping selective regions on substrate 6. They are electrically insulated from each other via reversed biased PN junctions. The dopant type for piezoresistive sensing elements 23 is according to whether substrate 6 is p-type or n-type. For p-type substrate 6, an n-type dopant is used. For n-type substrate 6, a p-type dopant is used instead. Preferably, each piezoresistive sensing element 23 is further formed with type-A highly doped regions 9, the purpose of which is to increase the doping level in selective portions of piezoresistive sensing element 23. Therefore, the dopant type for the type-A highly doped regions 9 must be the same as the dopant type in the original non-highly doped portions of piezoresistive sensing element 23. Since the sheet resistance in the non-highly-doped portion is approximately 100 Ω/square whereas the sheet resistance in the highly-doped portion is only 15 Ω/square, having type-A highly doped regions 9 in each piezoresistive sensing element 23 locally reduces the electrical resistance, thus forming highly conductive regions. As a result, the total electrical resistance in each piezoresistive sensing element 23 primarily comes from a few remaining longitudinal segments that are non-highly doped. In actual pressure measurements, it is these non-highly doped longitudinal segments, which are housed inside the upper sealed cavity and oriented in the same direction, that produce the largest electrical resistance change. Reducing the electrical resistance of piezoresistive sensing elements 23 in selective regions using type-A highly doped regions 9 therefore increases the overall percentage change in the electrical resistance of piezoresistive sensing element 23; and hence improves the measurement accuracy of the pressure sensor. Moreover, through the connections between the metal contacts 8 and the type-A highly doped regions 9, good electrical contacts between metal contacts 8 and piezoresistive sensing elements 23 can be assured. Additionally, type-B highly doped regions 10 and their associated metal contacts 8 are further provided, the purpose of which is for making electrical connections between external electrical circuit and the remaining regions of substrate 6 that are not a part of the piezoresistive sensing elements 23. These electrical connections provide the necessary reverse bias for the PN junctions. The dopant type for these type-B highly doped regions must therefore be the same as the substrate 6 dopant type to ensure that the metal contacts 8 makes good electrical contacts with the substrate 6.

Figure 8:
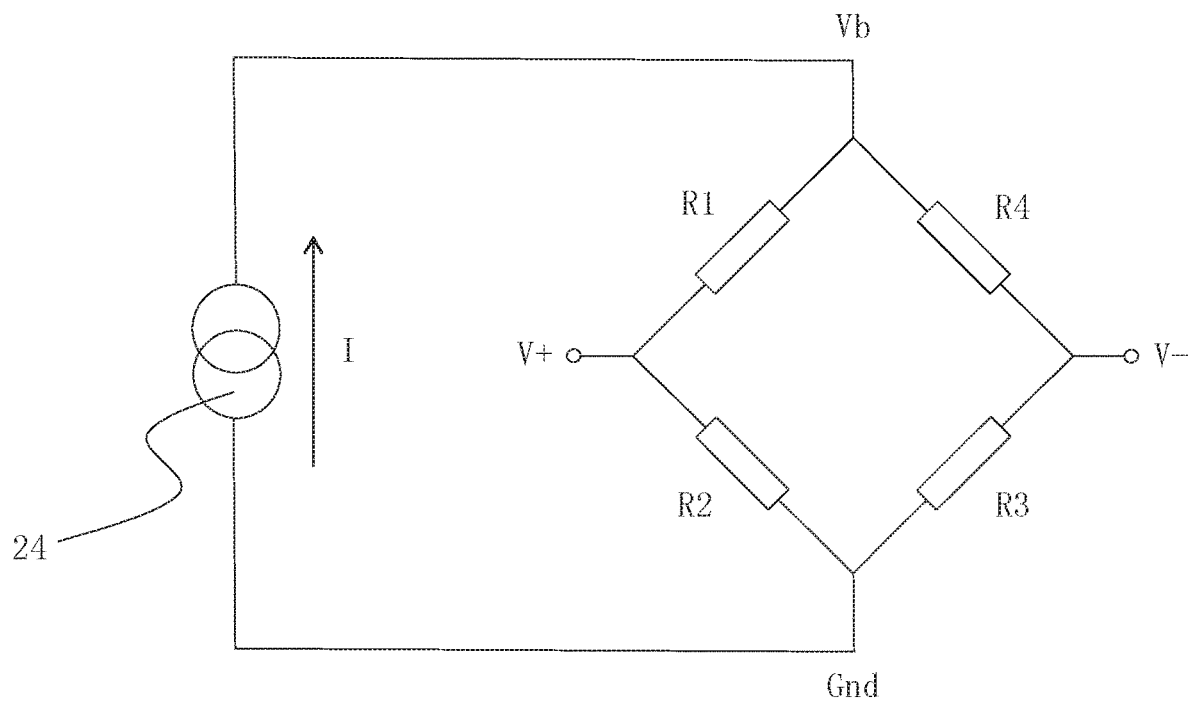
FIG. 8 is a circuit diagram of the piezoresistive sensing elements connected in a Wheatstone bridge configuration.

Since the four piezoresistive sensing elements R1 to R4 are identical, when the pressure sensor die is not subjected to an external pressure, the electrical resistance in R1 to R4 should be the same in theory. Preferably, the two perpendicular sets of piezoresistive sensing elements, R1, R3 and R2, R4, are oriented along different crystallographic directions such that when the pressure sensor die is uniformed compressed and free to deform under the external pressure, the difference in the piezoresistance effect between the two sets of piezoresistive sensing elements, R1, R3 and R2, R4, is maximized, thus resulting in unequal electrical resistance changes. Stress, however, is not the only factor that affects the electrical resistance values in piezoresistive sensing elements 23. Other factors, such as the temperature in the environment, will change the electrical resistance values as well. For this, preferably and with reference to FIG. 8, piezoresistive sensing elements R1 to R4 are electrically connected in a Wheatstone bridge configuration. A constant current source 24 supplies the electric current going through the Wheatstone bridge. The external pressure can be calculated by measuring the voltage difference between points V+ and V−. When the pressure sensor die is not subjected to external pressure, the electrical resistances in piezoresistive sensing elements R1 to R4 are almost identical; the voltage between points V+ and V− is then close to zero. On the other hand, when an external pressure induces unequal electrical resistance changes between R1, R3 and R2, R4, a voltage develops between points V+ and V−. A major advantage of the Wheatstone bridge configuration is the reduction of common-mode errors. For example, as the temperature changes, the electrical resistances of all four piezoresistive sensing elements change by about the same amount. As a result, when there is no external pressure, the voltage between points V+ and V− remains close to zero. In the present invention, the Wheatstone bridge can be powered by a constant voltage source or a constant current source, but a constant current source is preferred because the negative temperature coefficient of silicon piezoresistance effect is partially offset by the positive temperature coefficient of resistance, resulting in an overall reduced scale factor error over temperature. Furthermore, the bridge voltage, represented by Vb which can be measured, contains temperature information which is useful for further temperature error correction.

With reference to FIGS. 1 and 3, the preferable size of the present pressure sensor die is approximately 1.6 mm in length, 1.6 mm in width and 1.2 mm in thickness; the respective thicknesses of the cap, substrate and base are approximately 0.5, 0.2 and 0.5 mm. The upper sealed cavity and the lower sealed cavity each measures approximately 0.4 mm in length, 0.4 mm in width and 0.2 mm in height. In manufacturing, an 8 inch silicon wafer can contain thousands to over 10,000 gross pressure sensor dice, thus resulting in a significant reduction in die cost. However, it should be noted that the foregoing dimensions of the preferred embodiment are for illustrative purposes only. The present invention is not limited to this embodiment and all dimensions can be tailored for a particular design.

In the first embodiment, the piezoresistive sensing elements 23 are electrically insulated by reverse biased PN junctions, the leakage current of which increases exponentially with temperature. As the temperature rises above 150° C., the insulating property of the reverse biased PN junction will fail. Therefore the first embodiment is only suitable for applications in which the temperature is below 150° C.

With reference to FIGS. 4-7, a pressure sensor die is shown according to the second embodiment of the present invention. The operating principle, die size and external electrical circuit in this embodiment are the same as those in the first embodiment with the exception that the substrate 6 is using a silicon-on-insulator construction, which comprises a handle layer 1, a device layer 2, and a silicon oxide layer 4 between handle layer 1 and device layer 2 all connected together. The silicon oxide layer 4 is also referred to as a "buried" silicon oxide layer and serves to be the electrical insulation between handle layer 1 and device layer 2. Distinct from the first embodiment, the piezoresistive sensing elements 23 in the second embodiment are formed on device layer 2. Moreover, a silicon oxide layer 4 is formed along the sidewalls of each piezoresistive sensing element 23. As a result, each piezoresistive sensing element is completely wrapped around and fully insulated with a layer of silicon oxide 4 on the top, the bottom and along the sides. This dielectric isolation scheme not only reduces crosstalk and interference among sensing elements, it also enables the pressure sensor die to operate at temperature as high as 250° C. and not limited by the PN junction insulation failure as in the first embodiment. Furthermore, type-A highly doped regions 9 are formed at the two terminals as well as at the turnaround corners of each piezoresistive sensing element 23, the purpose of which is to increase the doping level in selective portions of piezoresistive sensing element 23, thus forming highly conductive regions, the function of which is the same as in the first embodiment. However, the piezoresistive sensing elements 23 in the second embodiment are single crystalline silicon resistors formed on device layer 2, the dopant type for the type-A highly doped regions 9 must therefore be the same as the dopant type in device layer 2. In this embodiment, the thickness of device layer 2 is approximately 2 m and the thickness of the buried oxide layer is approximately 1 µm. However, it should be noted that the foregoing dimensions of the preferred embodiment are for illustrative purposes only. The present invention is not limited to this embodiment and all dimensions can be tailored for a particular design.

Figure 9:
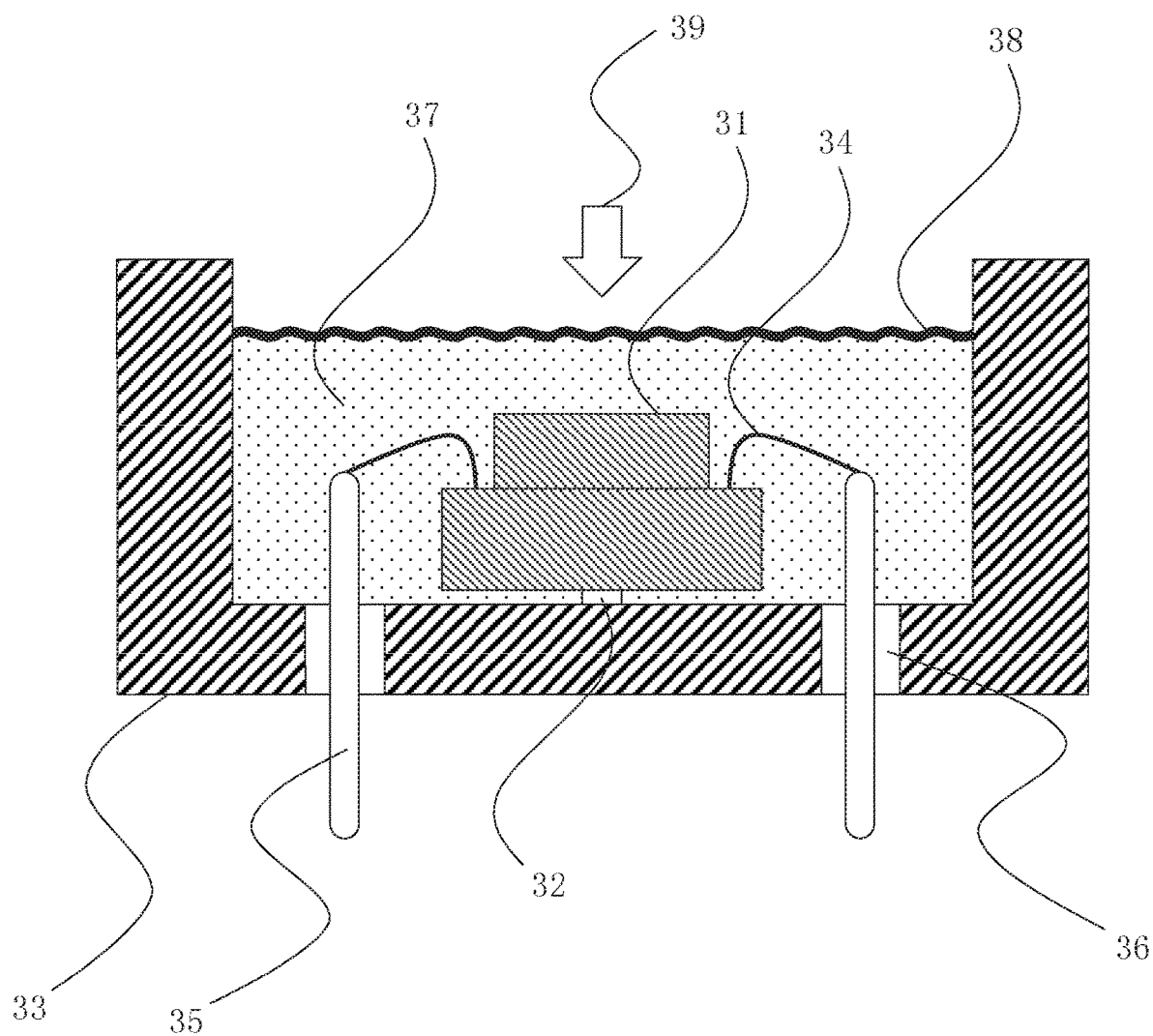
FIG. 9 is a diagrammatic view of the pressure sensor.

FIG. 9 illustrates a diagrammatic view of the pressure sensor, which can be applied to the first and the second embodiments of the pressure sensor die. Pressure sensor die 31 is installed within chamber 33, which is an enclosure defined within a metal housing. Chamber 33 is filled with electrical insulating fluid 37 in which pressure sensor die 31 is immersed. In one embodiment, metal diaphragm 38 is provided to seal both pressure sensor die 31 and electrical insulating fluid 37 within chamber 33. External pressure 39 acting on metal diaphragm 38 is transmitted via electrical insulating fluid 37 to the pressure sensor die 31. Preferably, metal diaphragm 38 is a corrugated baffle with a low stiffness; so almost all of external pressure 39 is transmitted to pressure sensor die 31. Furthermore, the contact between pressure sensor die 31 and the chamber housing is kept to a minimum. For example, pressure sensor die 31 is only attached to the chamber housing through one or several dots or lines of die adhesive 32. Moreover, die adhesive 32 is compliant enough so that under the action of the hydrostatic pressure in electrical insulating fluid 37, pressure sensor die 31 is uniformly compressed and free to deform. Such installation further prevents packaging stresses, which can be caused by the deformation of the chamber housing due to external forces or temperature change, from being transmitted to pressure sensor die 31.

Preferably, within the pressure sensor die 31, the upper sealed cavity formed between substrate 6 and cap 3, and the lower sealed cavity formed between substrate 6 and cap 3 are both vacuum sealed, so that the pressure measured by the pressure sensor is absolute pressure referenced to vacuum. In one embodiment, metal bond pads on pressure sensor die 31 are connected via bond wires 34 to metal pillars 35, which are in turn connected to the external electrical circuit. Metal pillars 35 are electrically insulated from one another by insulator 36.

Next the crystallographic orientations of the pressure sensor die 31 and piezoresistive sensing elements 23 will be described. Regarding the silicon piezoresistance effect, besides varying with stress, the silicon electrical resistivity further varies with the dopant type (p or n), doping concentration, and crystallographic orientation since single crystalline silicon is anisotropic, the details for which are described in Y. Kanda, "A Graphical Representation of the Piezoresistance Coefficients in Silicon," IEEE Transactions on Electron Devices, vol. ED-29, no. 1, pp. 64-70, 1982. In particular, the change in electrical resistivity and its relationship with stresses and piezoresistive coefficients can be expressed as $$\Delta\rho_{11}/\rho = \pi_{11}\sigma_{11} + \pi_{12}\sigma_{22} + \pi_{13}\sigma_{33} + \pi_{14}\sigma_{23} + \pi_{15}\sigma_{13} + \pi_{16}\sigma_{12} \quad (1)$$

where 1, 2, 3 are the three orthogonal directions in a Cartesian coordinate system; $\Delta\rho 11/\rho$ is the relative change in silicon resistivity when both the electric field and electric current are along direction 1; $\sigma 11$, $\sigma 22$, $\sigma 33$ are the respective normal stresses along the 1, 2, 3 directions; $\sigma 23$, $\sigma 13$, $\sigma 12$ are the respective shear stresses along the 2-3, 1-3, 1-2 directions; and π11, π12, π13, π14, π15, π16 are the piezoresistive coefficients expressing the relationship between resistivity change and the various stresses.

Figure 5:
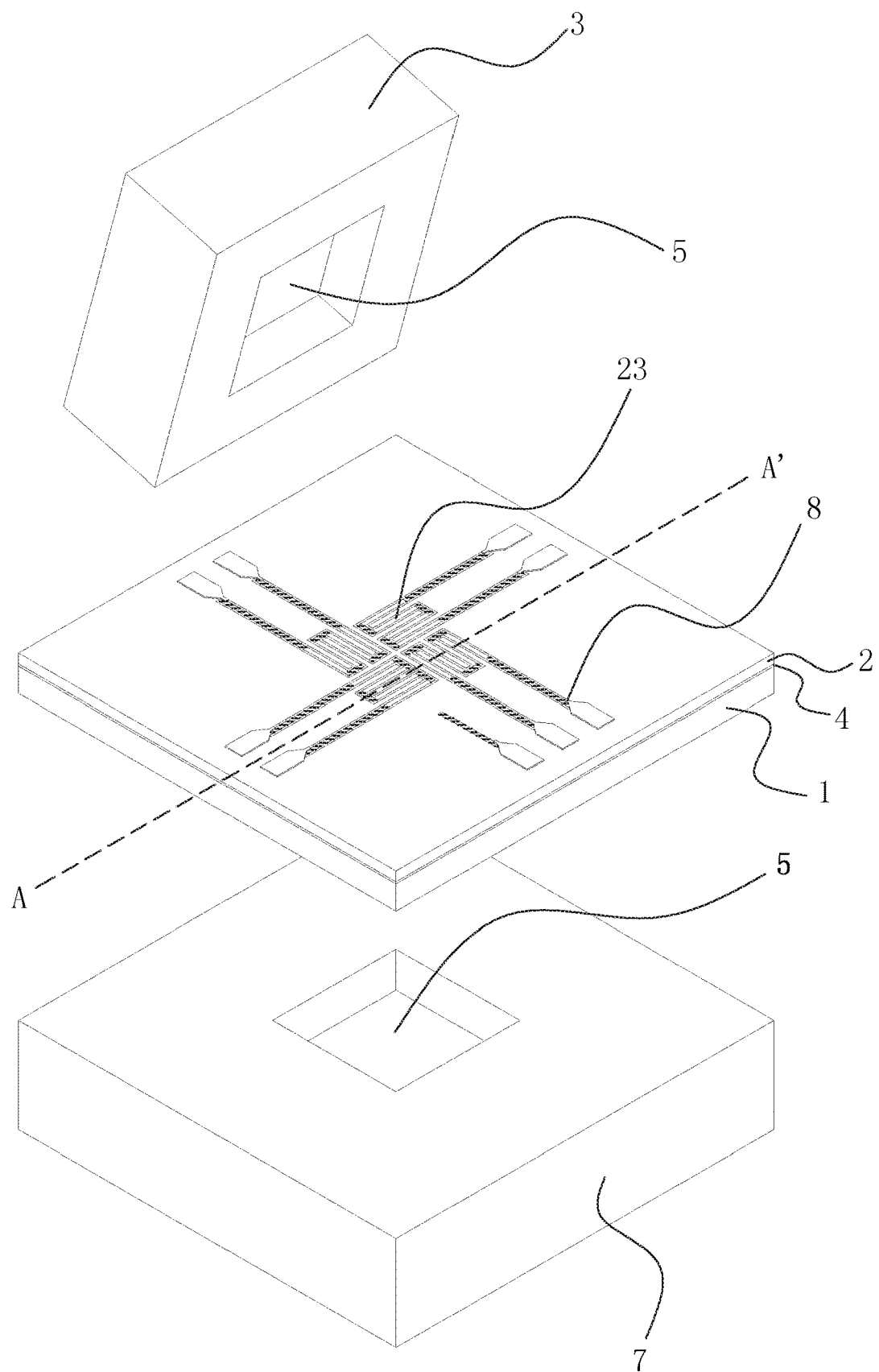
FIG. 5 is a perspective view of the pressure sensor die of FIG. 4 further with the cap and base detached and further with the top silicon oxide layer removed revealing various features on the device layer in the second embodiment of this invention.
Figure 6:
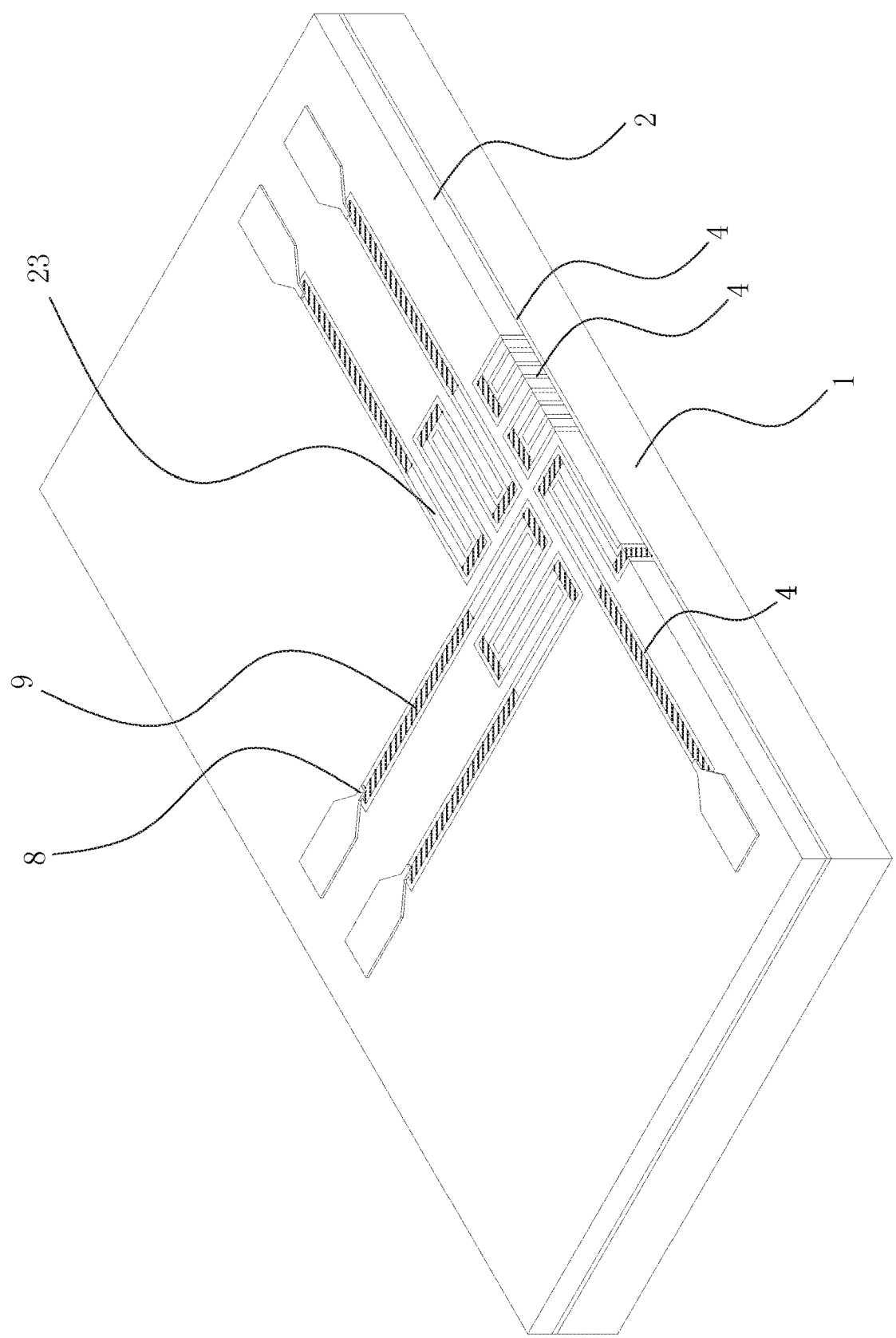
FIG. 6 is a cutaway view of the pressure sensor die of FIG. 5 along line AA'.

Assume that the top surface of said substrate 6 of said pressure sensor die 31 is perpendicular to direction 3 on plane 1-2, and that the piezoresistive sensing elements 23 are located on this plane. With reference to FIGS. 2 and 5, first of all, the critical (non-highly doped) portions of the four piezoresistive sensing elements 23 are facing toward the upper vacuum sealed cavity. The plane 1-2 on which they are located is therefore a surface free from externally applied stresses. As a result, the stress components associated with the normal direction 3, i.e., σ13, σ23, σ33, are all zero. The critical portions of the piezoresistive sensing elements 23 are therefore situated in a plane stress environment. Secondly, pressure sensor die 31 is installed inside chamber 33. The sensor die is uniformly compressed, and it is allowed to deform freely. Under these circumstances, the normal stresses acting on the external surfaces of the pressure sensor die are all comparable to the external pressure 39, and all the shear stresses are close to zero. Then further into said upper vacuum sealed cavity, on the said plane 1-2 on which said piezoresistive sensing elements 23 are located, σ12 is still close to zero, whereas σ11 and σ22 are comparable to each other and both scale approximately linearly with the external pressure 39, labeled as P.

Figure 10A:
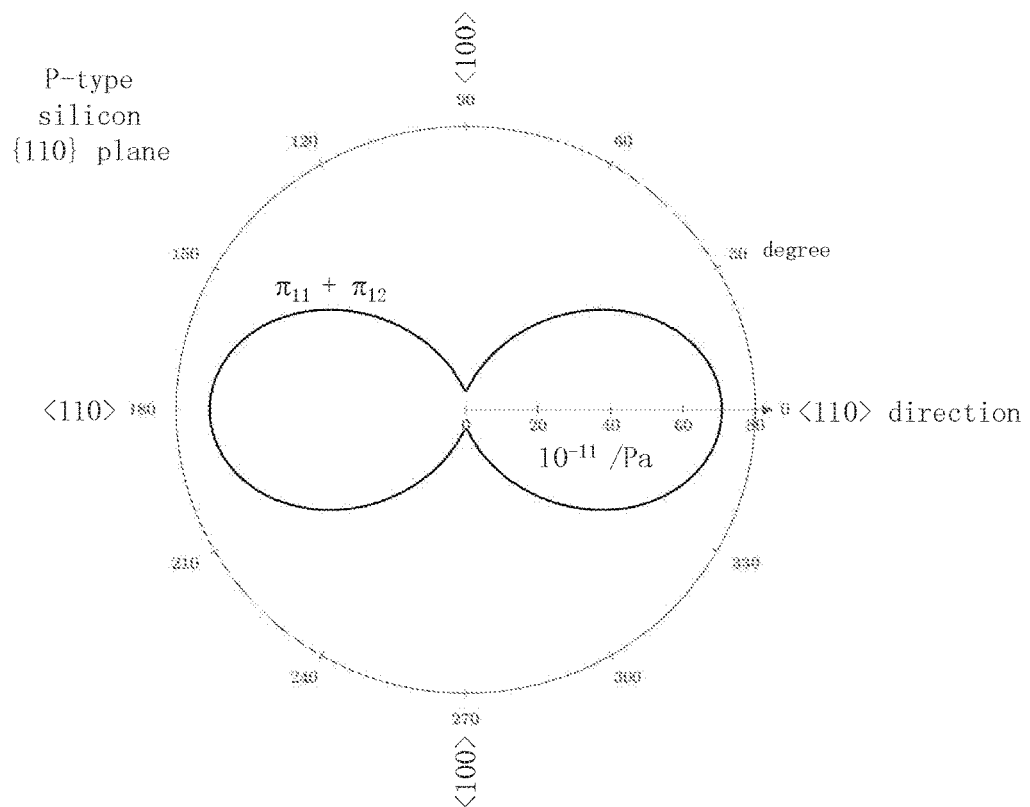
FIG. 10A is the variation of the piezoresistive coefficients $\pi 11+\pi 12$ versus crystallographic orientation on a {110} crystallographic plane of p-type silicon.
Figure 10B:
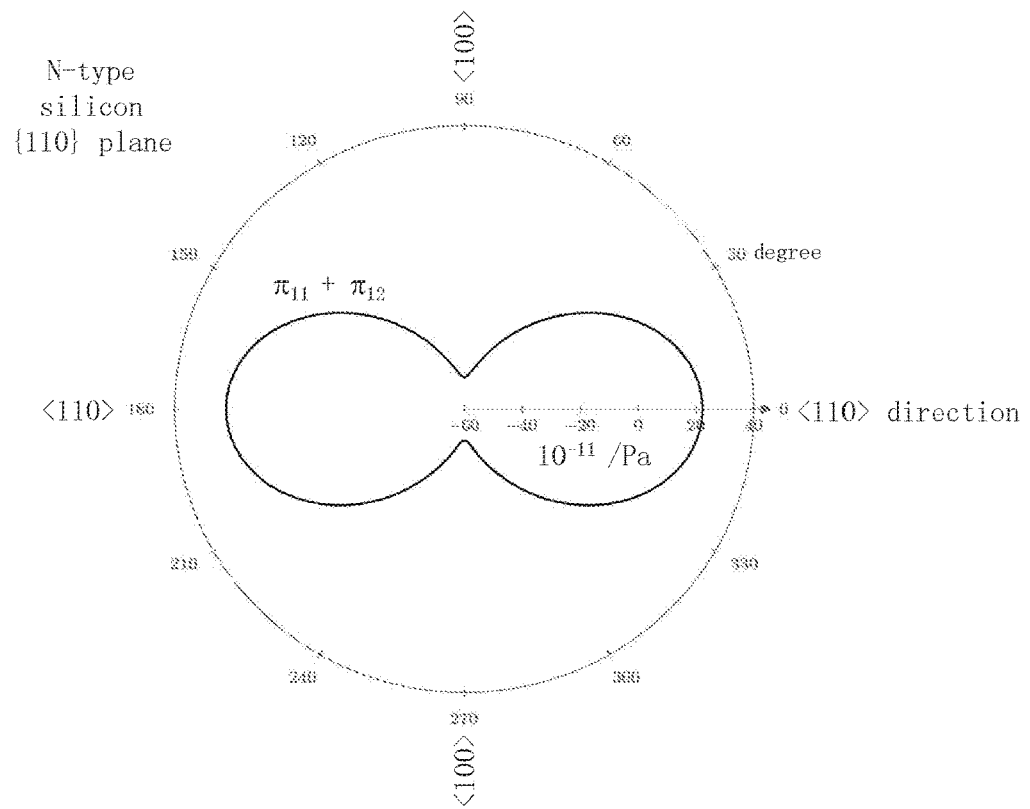
FIG. 10B is the variation of the piezoresistive coefficients $\pi 11+\pi 12$ versus crystallographic orientation on a {110} crystallographic plane of n-type silicon.
Figure 11:
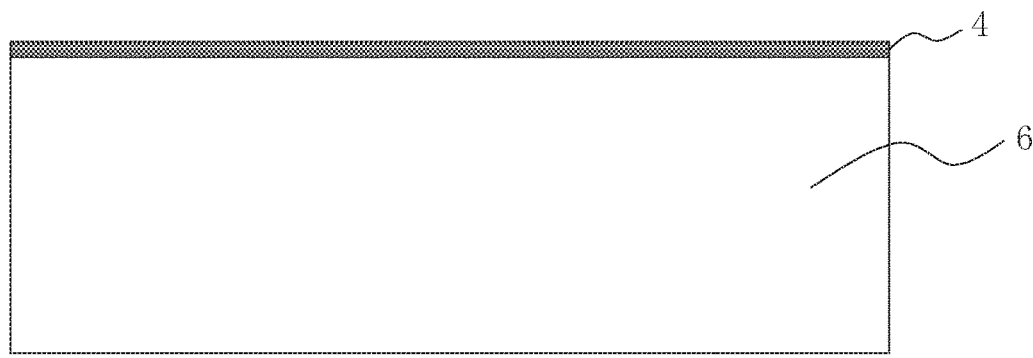
FIG. 11 is a cross-sectional view illustrating step 1 and step 2 of the first fabrication process in the first embodiment of the pressure sensor die.
Figure 11:
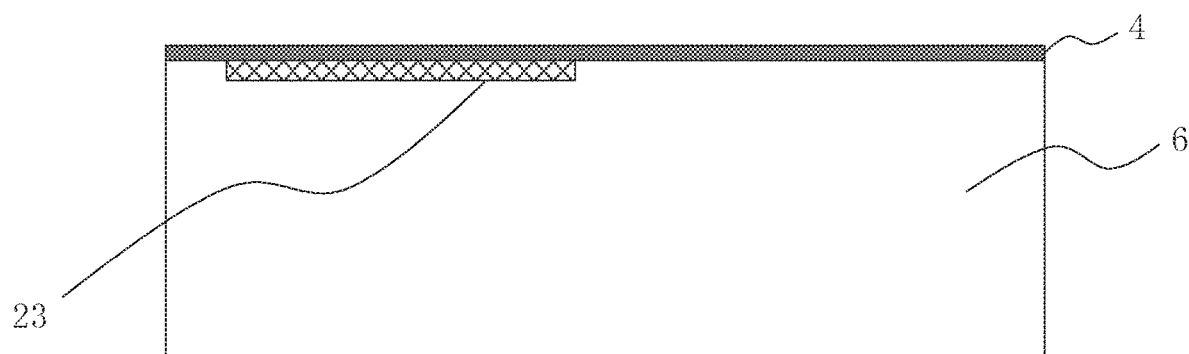
Figure 12:
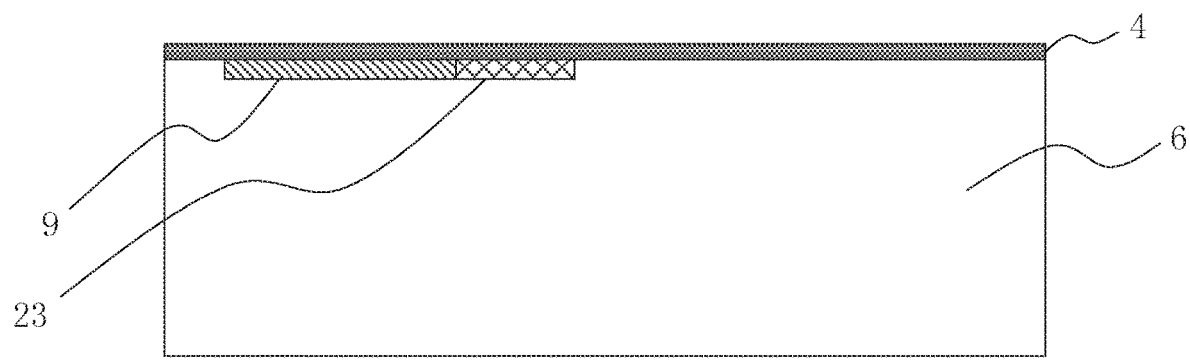
FIG. 12 is a cross-sectional view illustrating step 3 and step 4 of the first fabrication process in the first embodiment of the pressure sensor die.
Figure 12:
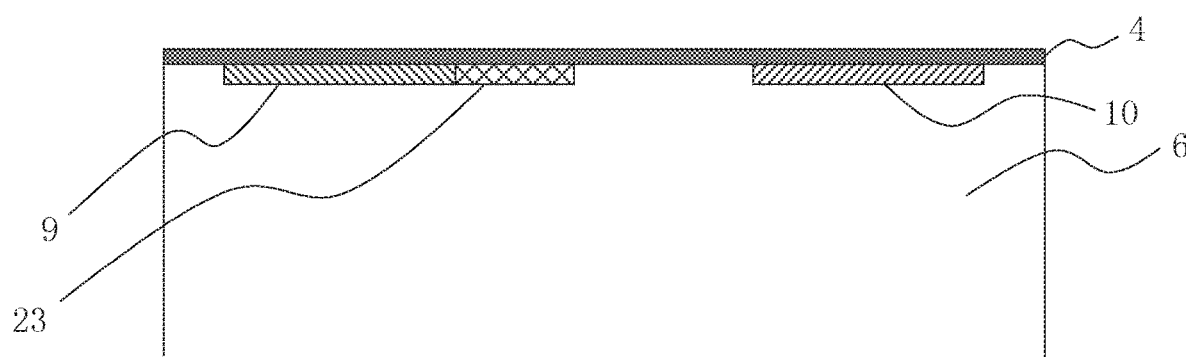
Figure 13:
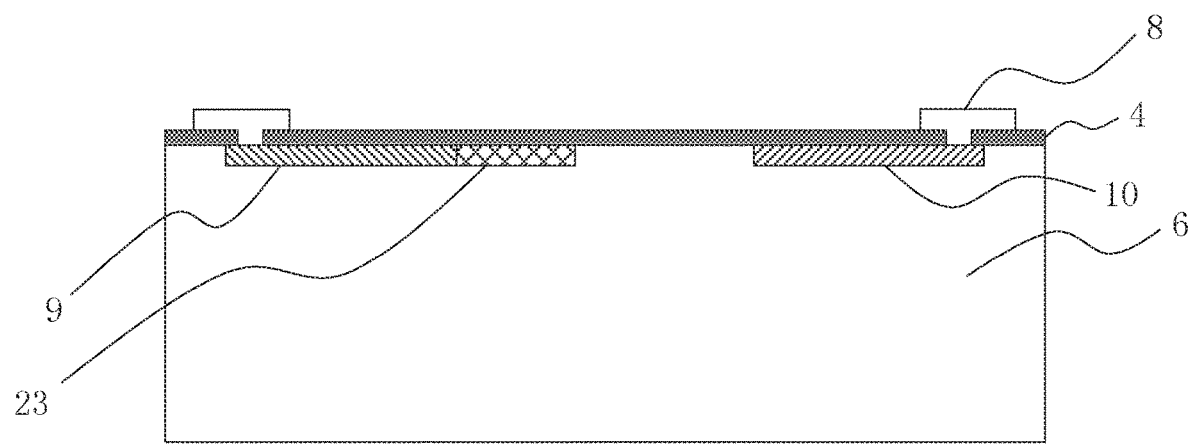
FIG. 13 is a cross-sectional view illustrating step 5 and step 6 of the first fabrication process in the first embodiment of the pressure sensor die.
Figure 13:
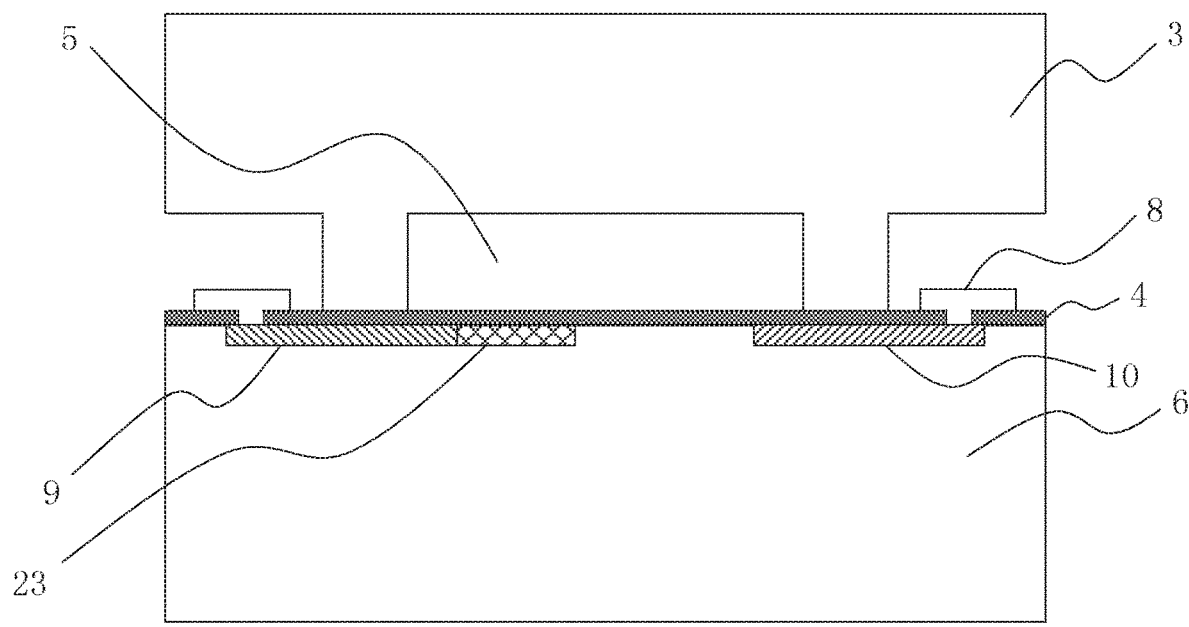
Figure 14:
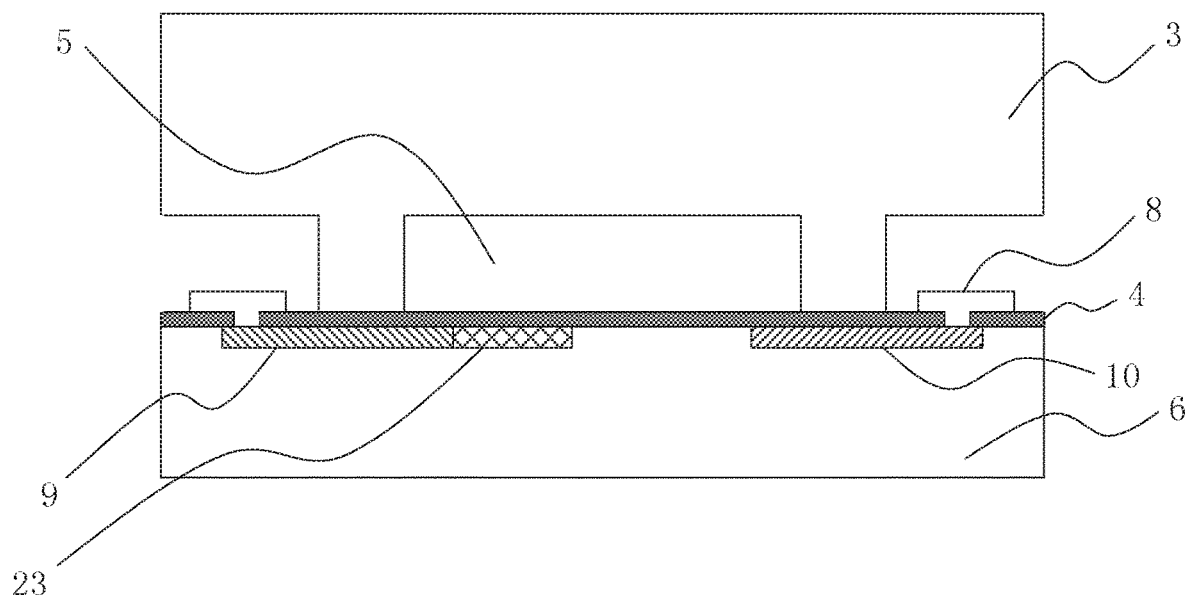
FIG. 14 is a cross-sectional view illustrating step 7 and step 8 of the first fabrication process in the first embodiment of the pressure sensor die.
Figure 14:
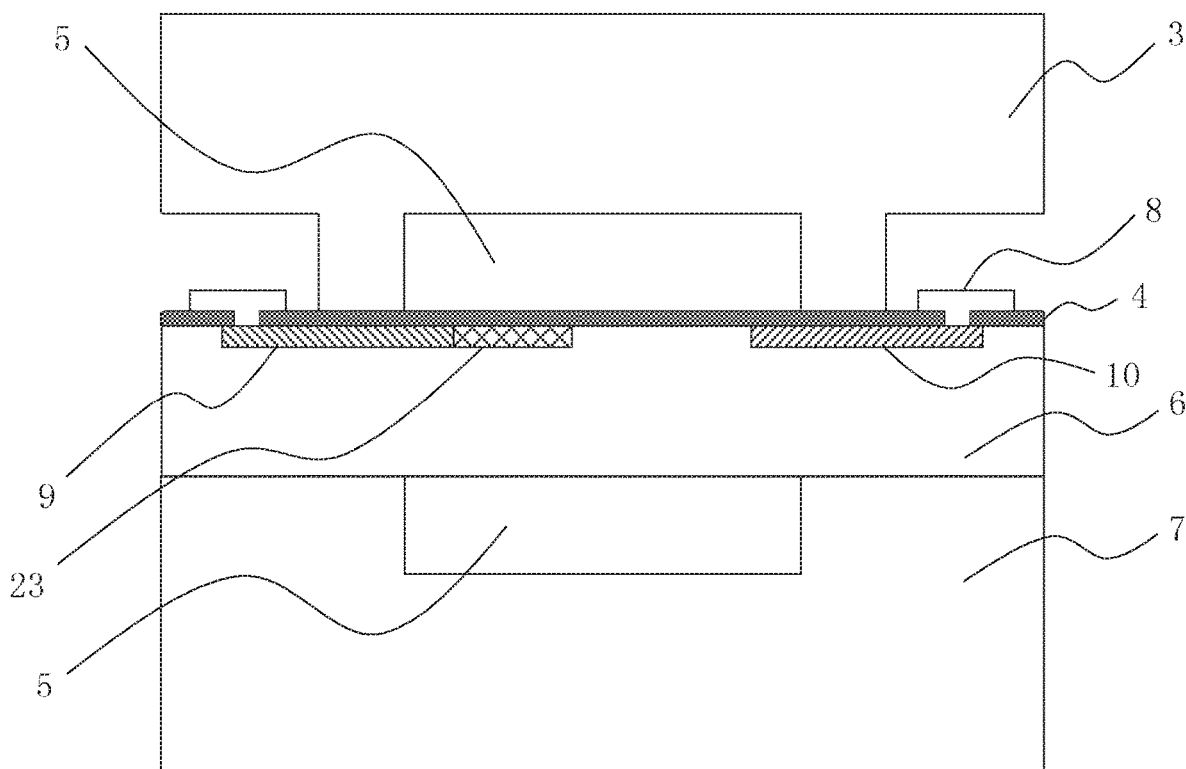
Figure 15:
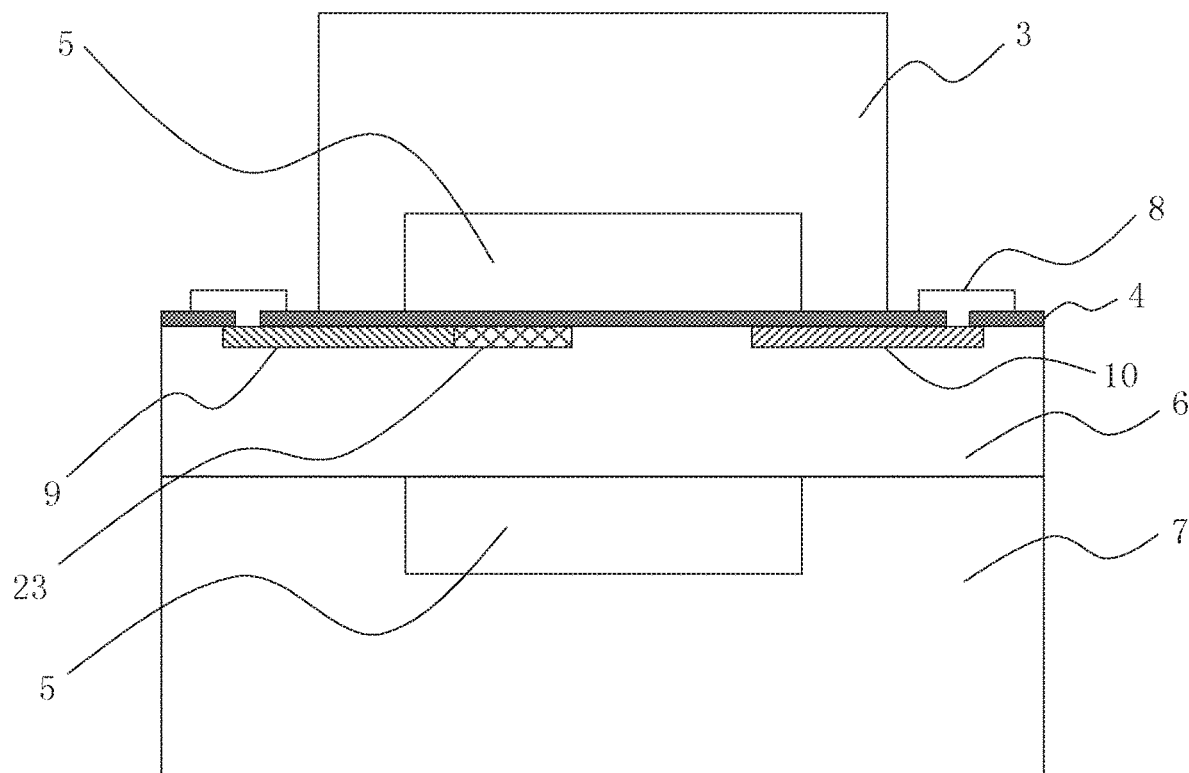
FIG. 15 is a cross-sectional view illustrating step 9 of the first fabrication process in the first embodiment of the pressure sensor die.
Figure 16:
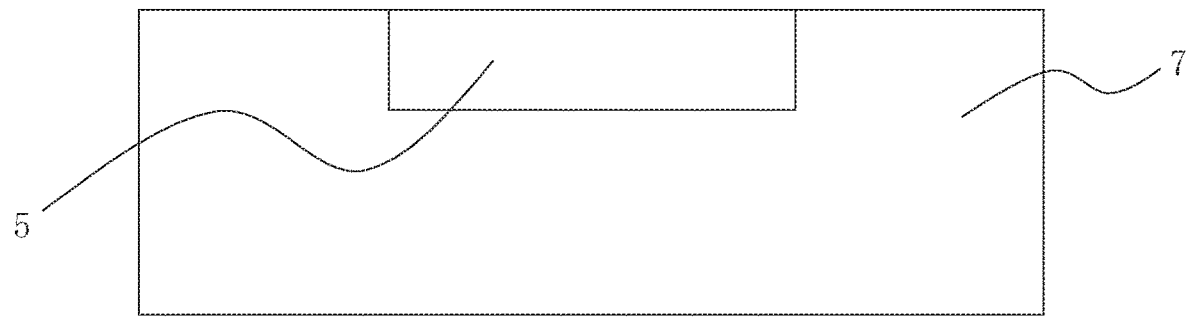
FIG. 16 is a cross-sectional view illustrating step 1 and step 2 of the second fabrication process in the first embodiment of the pressure sensor die.
Figure 16:
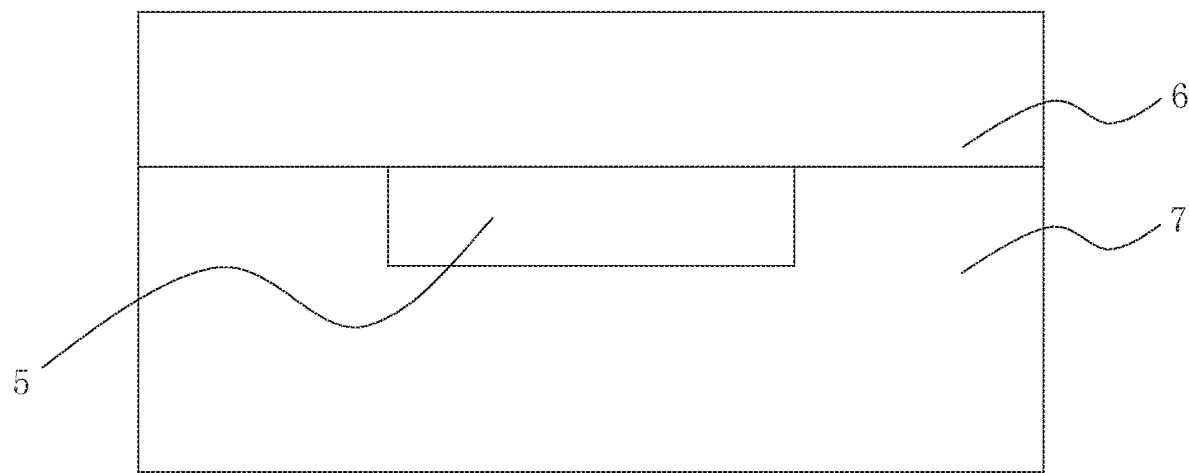
Figure 17:
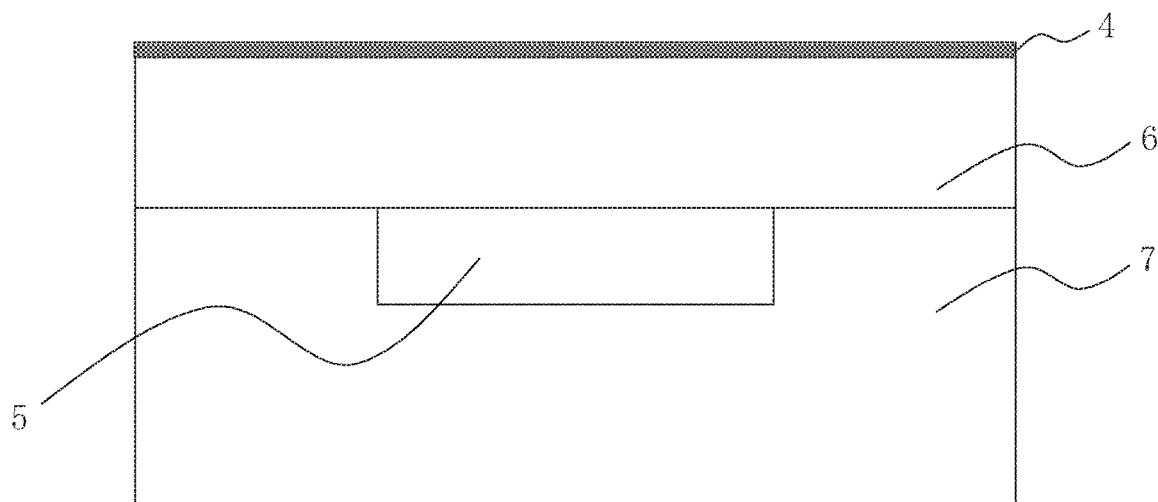
FIG. 17 is a cross-sectional view illustrating step 3 and step 4 of the second fabrication process in the first embodiment of the pressure sensor die.
Figure 17:
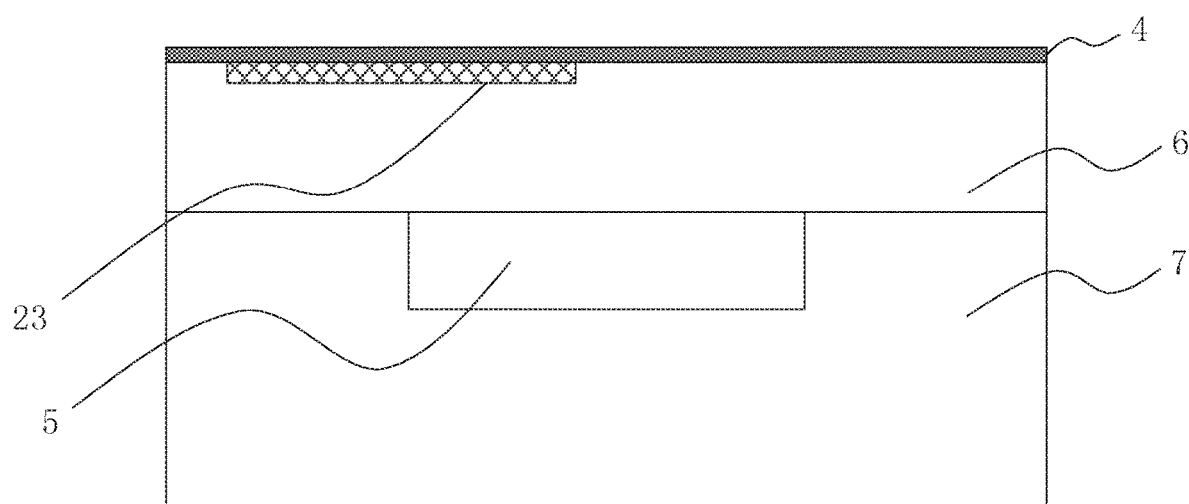
Figure 18:
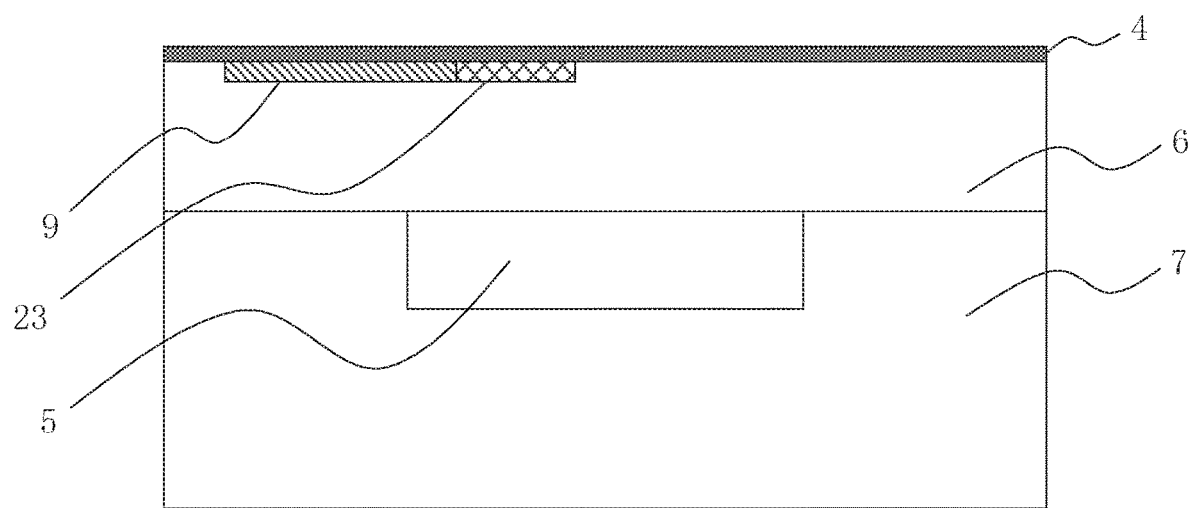
FIG. 18 is a cross-sectional view illustrating step 5 and step 6 of the second fabrication process in the first embodiment of the pressure sensor die.
Figure 18:
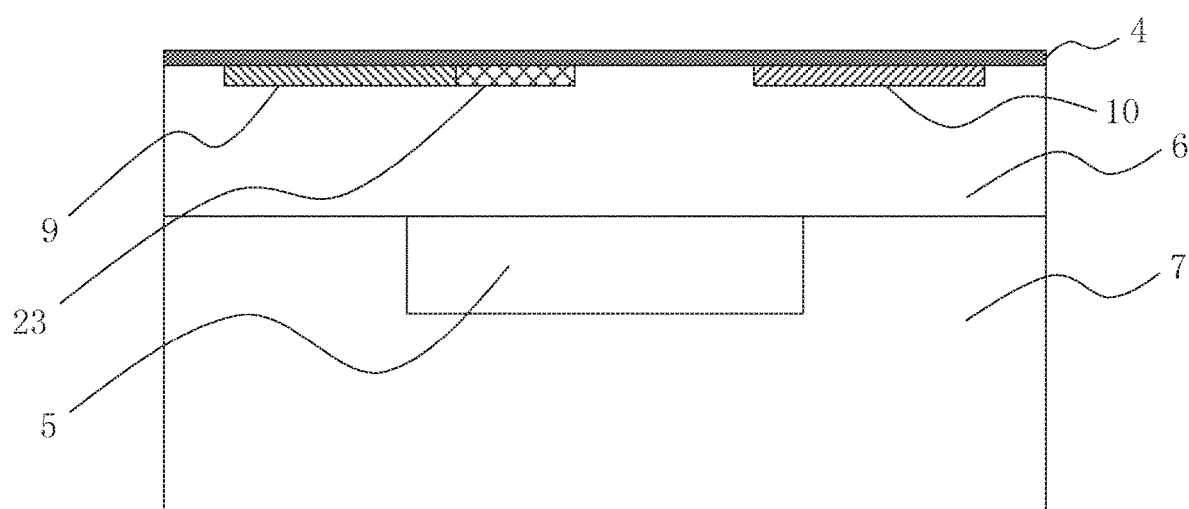
Figure 19:
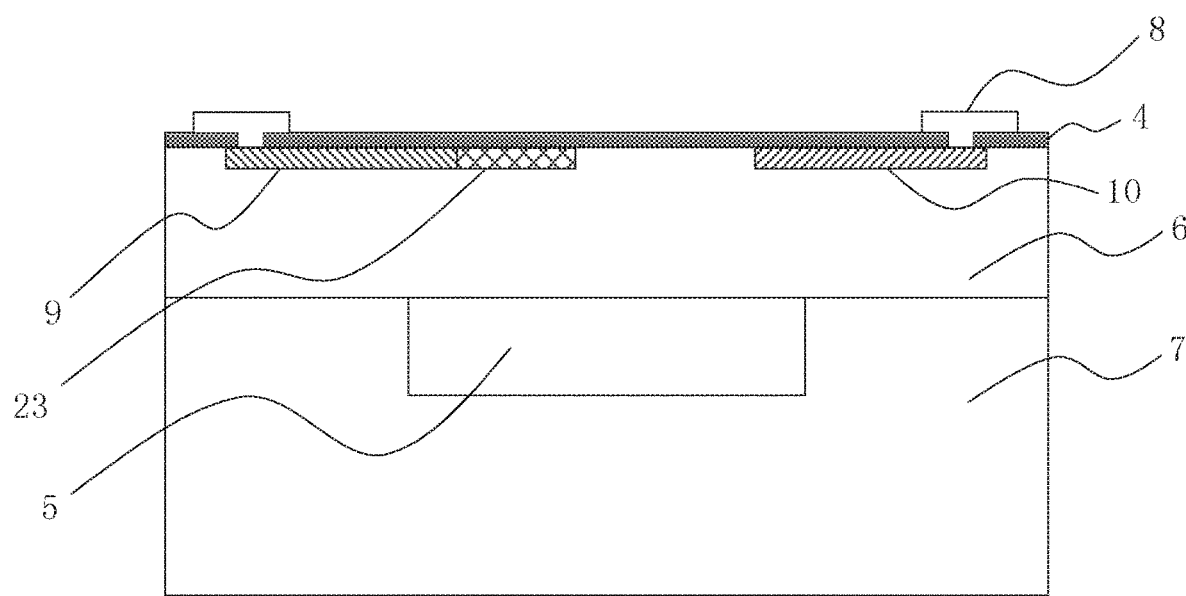
FIG. 19 is a cross-sectional view illustrating step 7 and step 8 of the second fabrication process in the first embodiment of the pressure sensor die.
Figure 19:
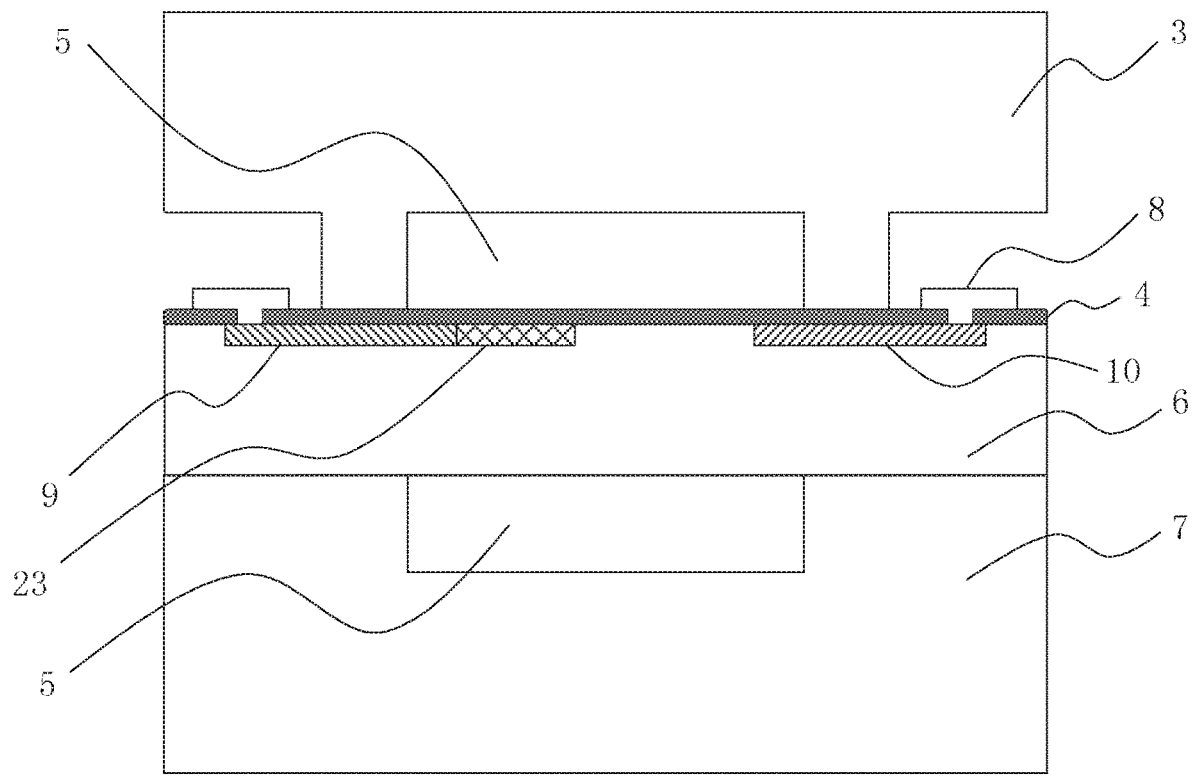
Figure 20:
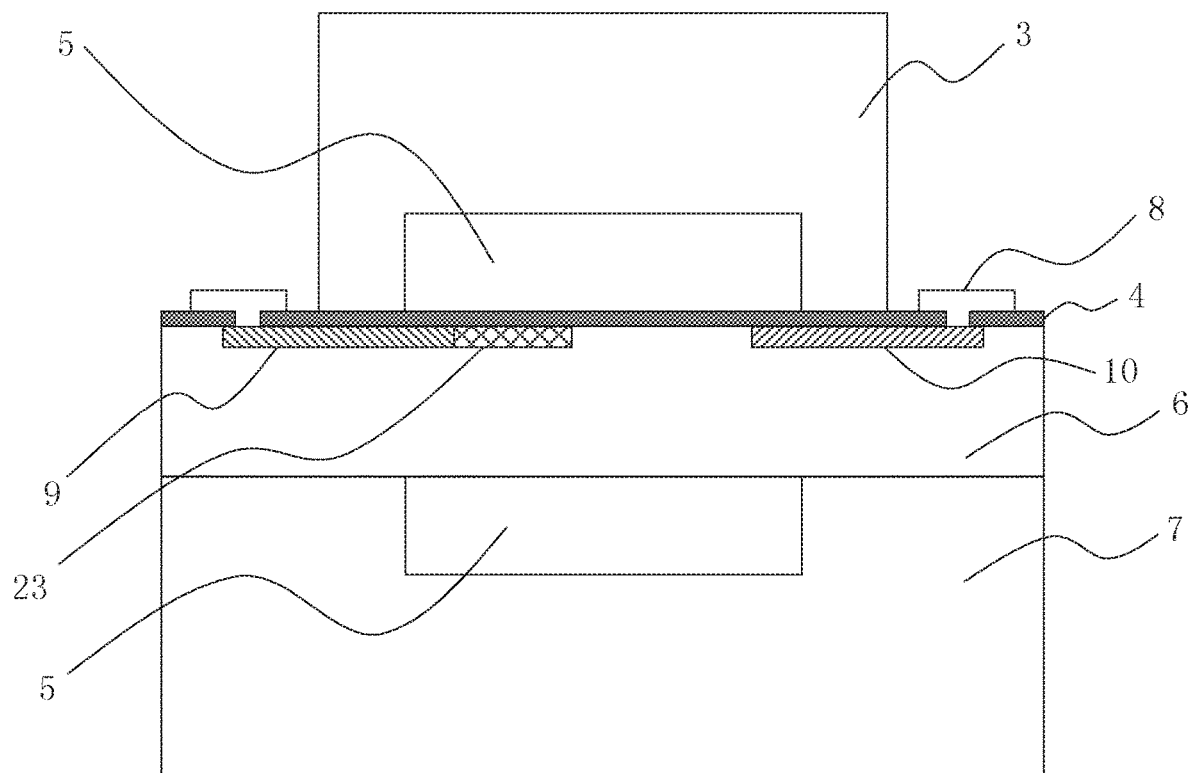
FIG. 20 is a cross-sectional view illustrating step 9 of the second fabrication process in the first embodiment of the pressure sensor die.
Figure 21:
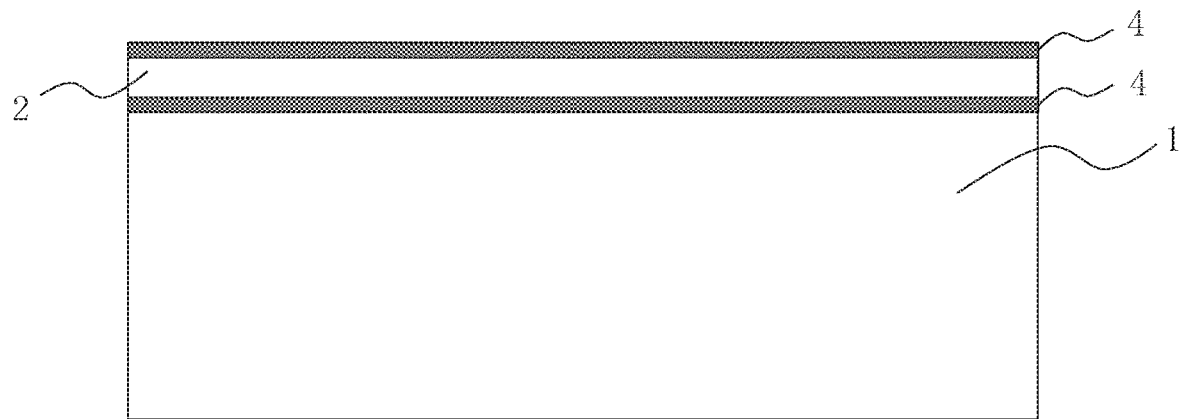
FIG. 21 is a cross-sectional view illustrating step 1 and step 2 of the first fabrication process in the second embodiment of the pressure sensor die.
Figure 21:
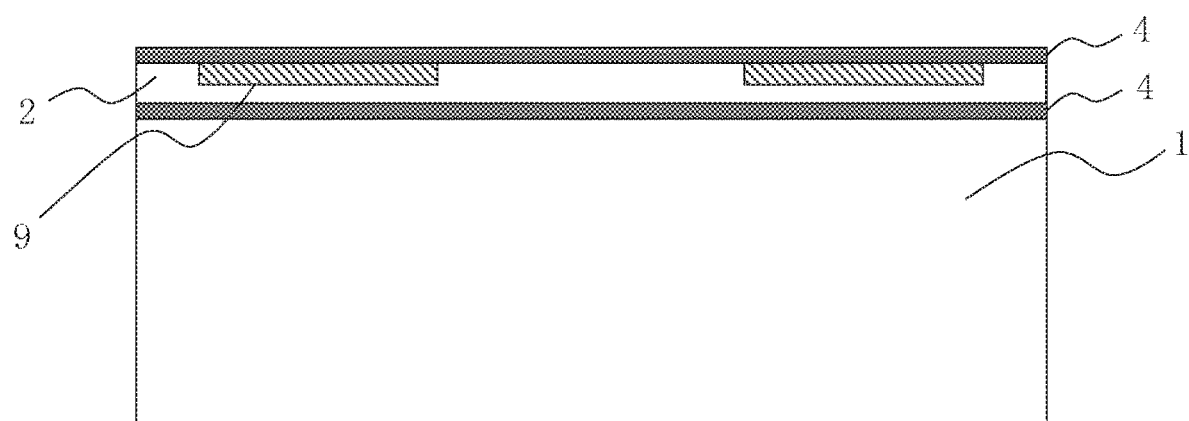
Figure 22:
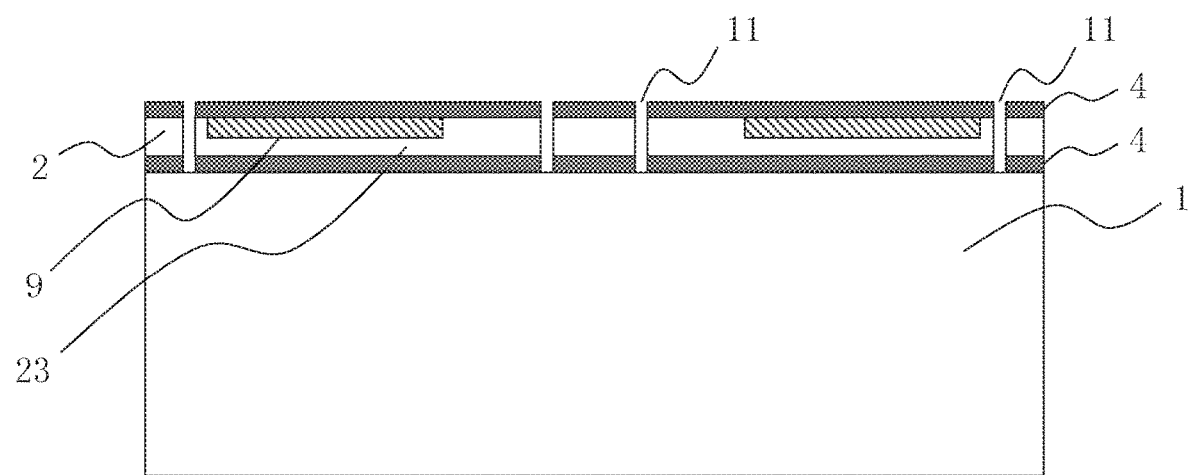
FIG. 22 is a cross-sectional view illustrating step 3 and step 4 of the first fabrication process in the second embodiment of the pressure sensor die.
Figure 22:
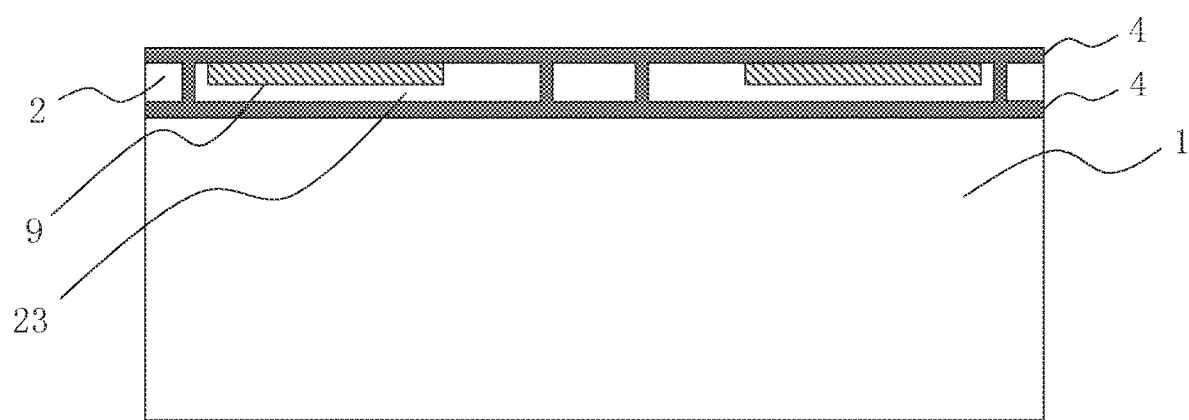
Figure 23:
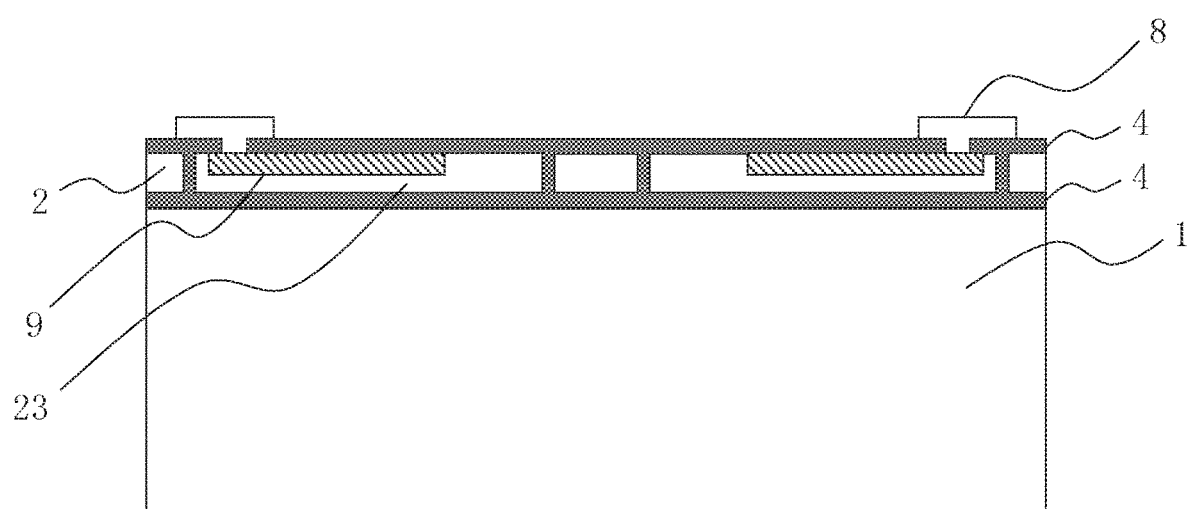
FIG. 23 is a cross-sectional view illustrating step 5 and step 6 of the first fabrication process in the second embodiment of the pressure sensor die.
Figure 23:
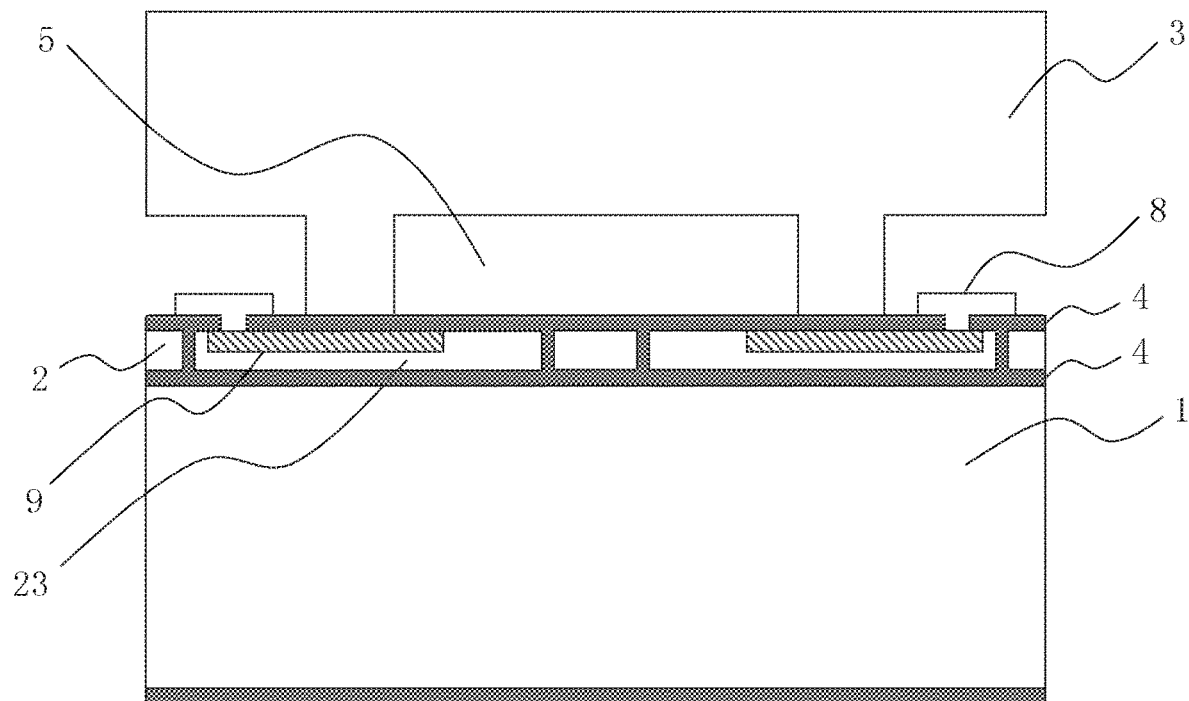
Figure 24:
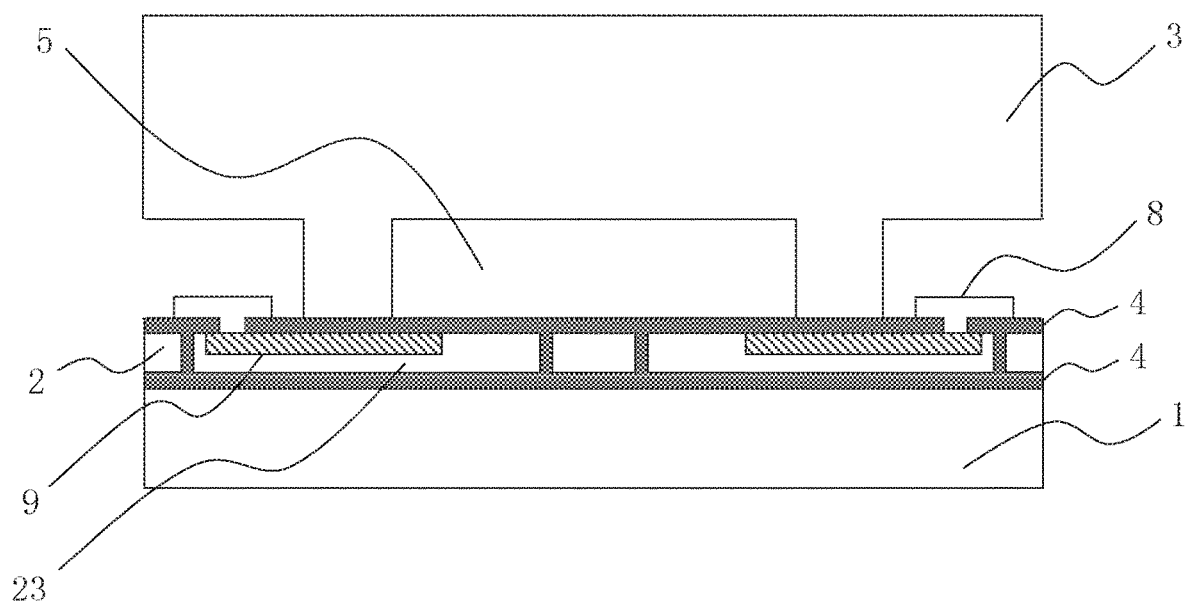
FIG. 24 is a cross-sectional view illustrating step 7 and step 8 of the first fabrication process in the second embodiment of the pressure sensor die.
Figure 24:
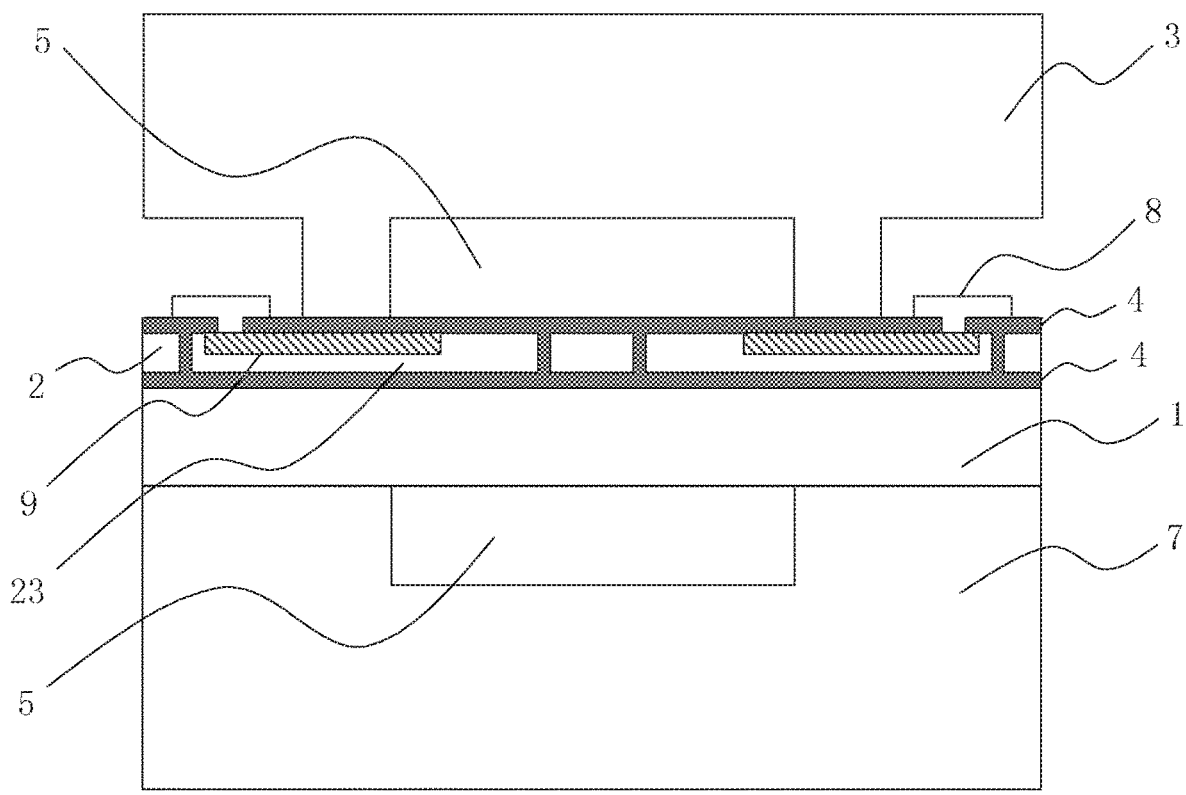
Figure 25:
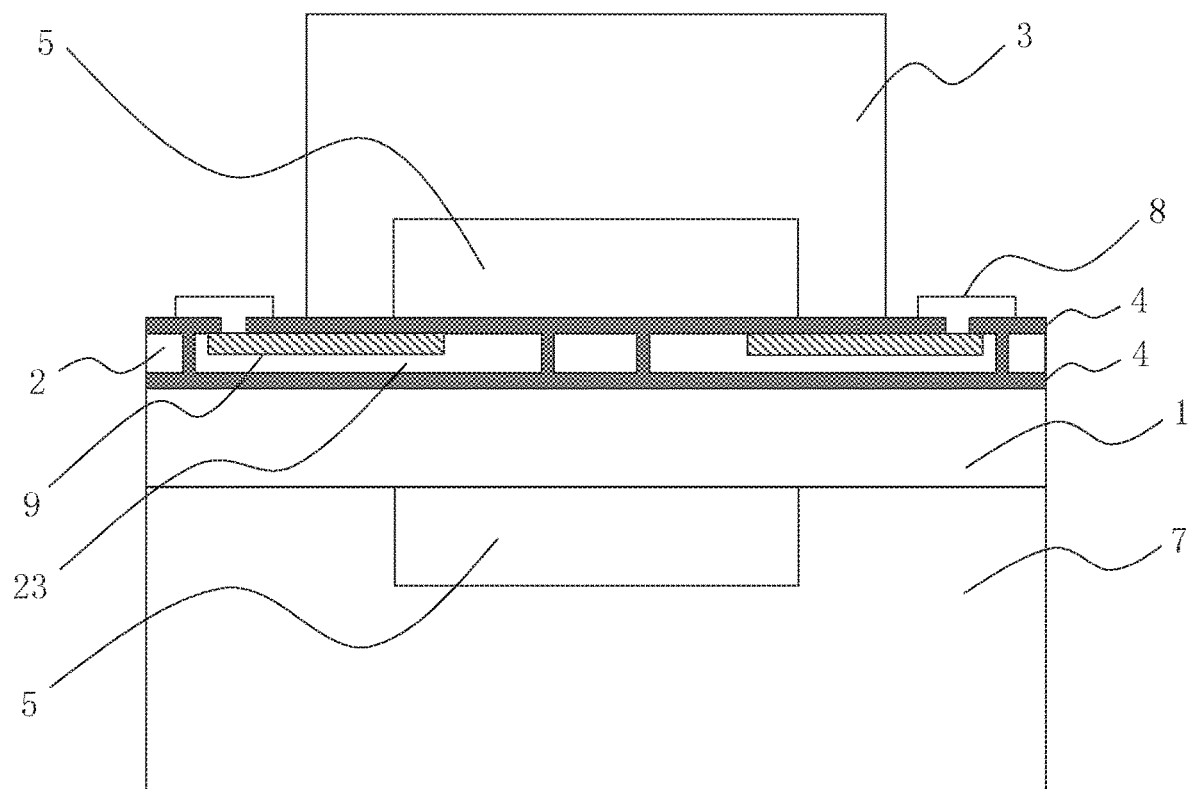
FIG. 25 is a cross-sectional view illustrating step 9 of the first fabrication process in the second embodiment of the pressure sensor die.
Figure 26:
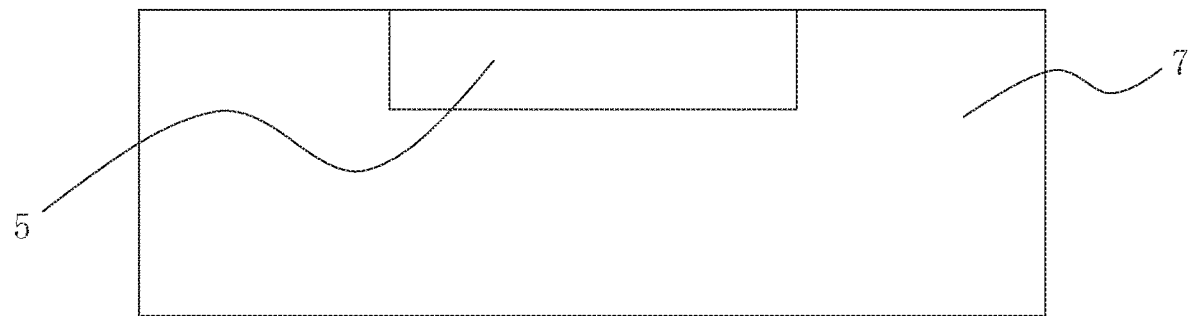
FIG. 26 is a cross-sectional view illustrating step 1 and step 2 of the second fabrication process in the second embodiment of the pressure sensor die.
Figure 26:
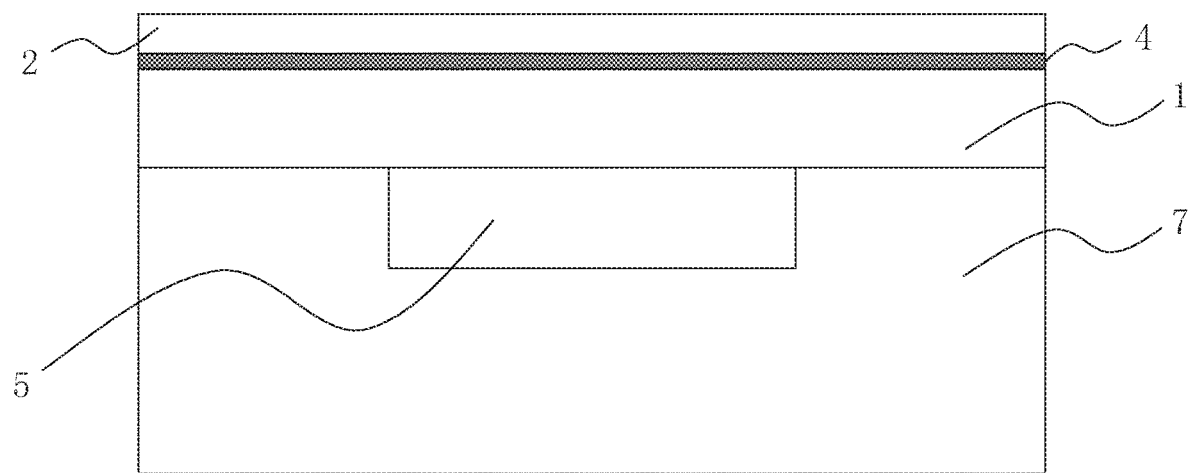
Figure 27:
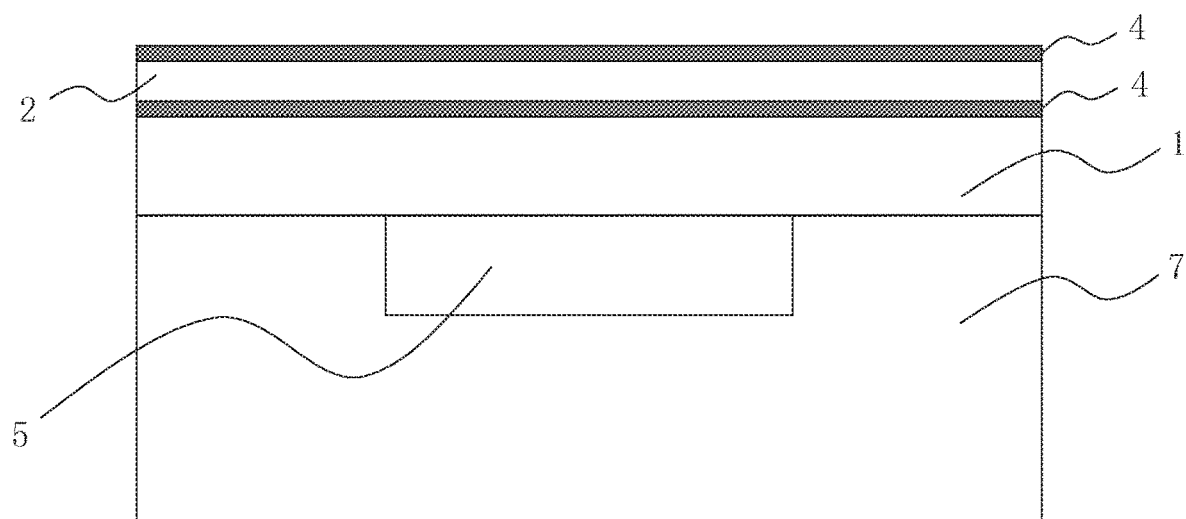
FIG. 27 is a cross-sectional view illustrating step 3 and step 4 of the second fabrication process in the second embodiment of the pressure sensor die.
Figure 27:
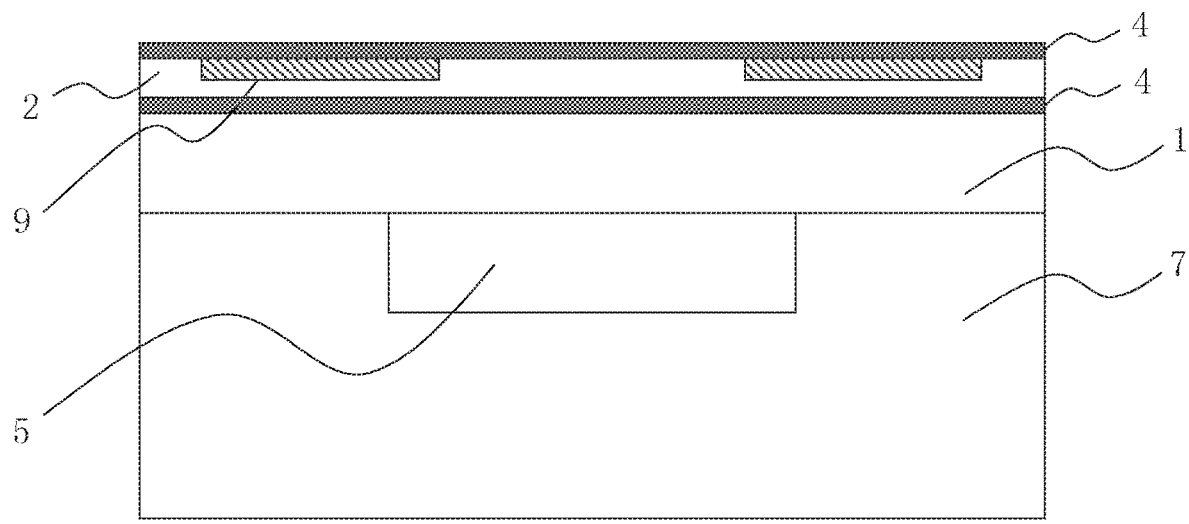
Figure 28:
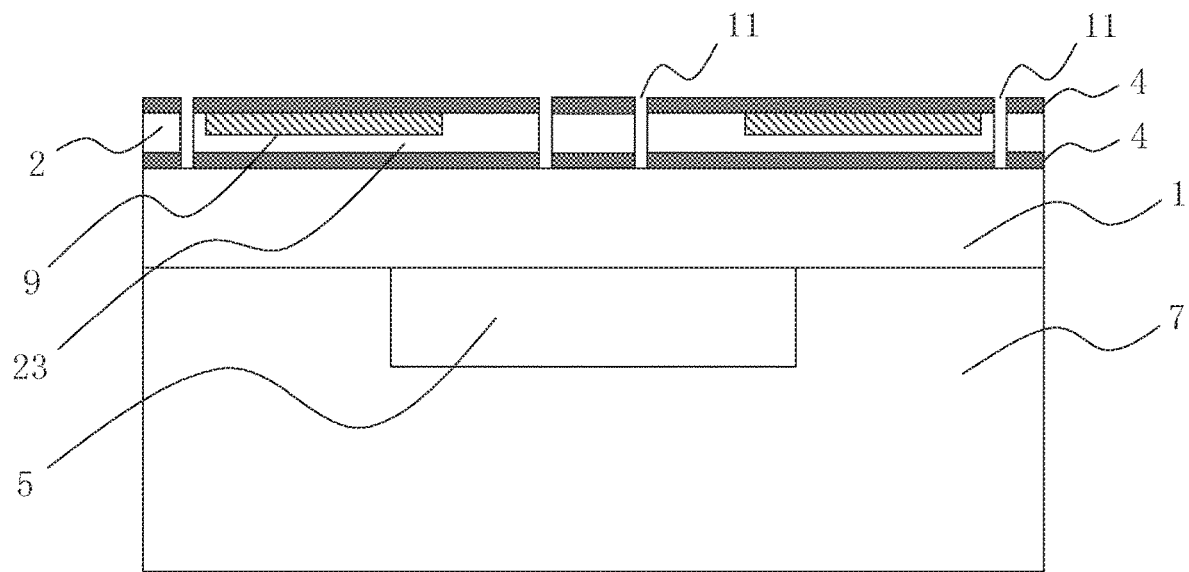
FIG. 28 is a cross-sectional view illustrating step 5 and step 6 of the second fabrication process in the second embodiment of the pressure sensor die.
Figure 28:
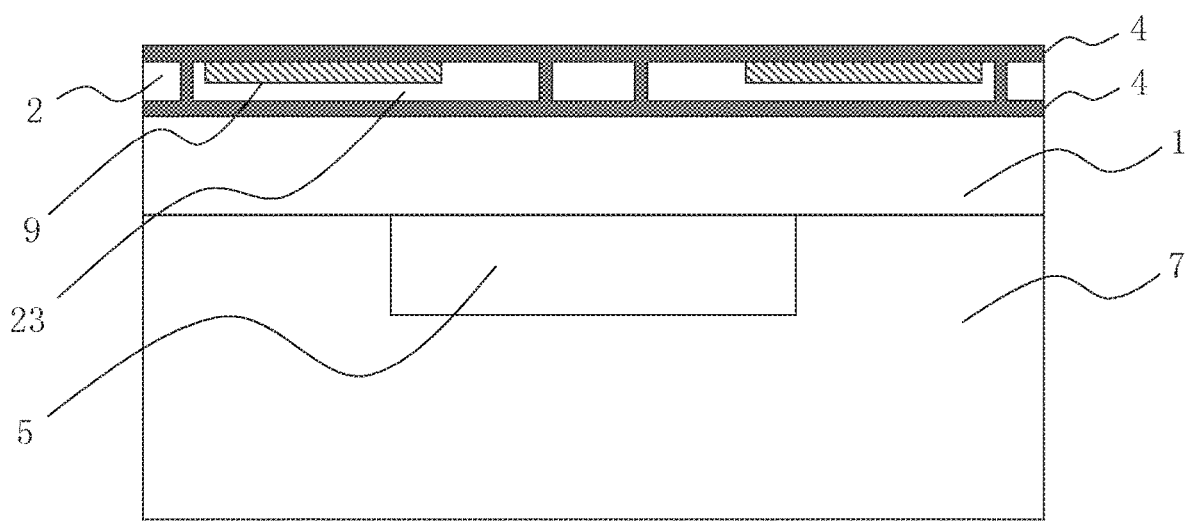
Figure 29:
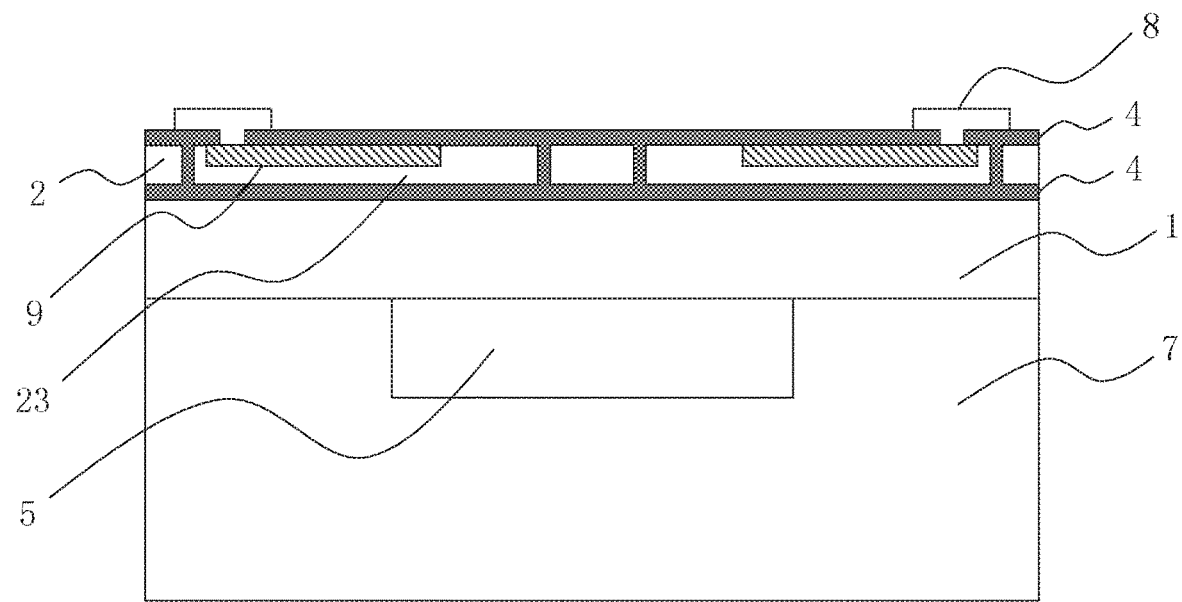
FIG. 29 is a cross-sectional view illustrating step 7 and step 8 of the second fabrication process in the second embodiment of the pressure sensor die.
Figure 29:
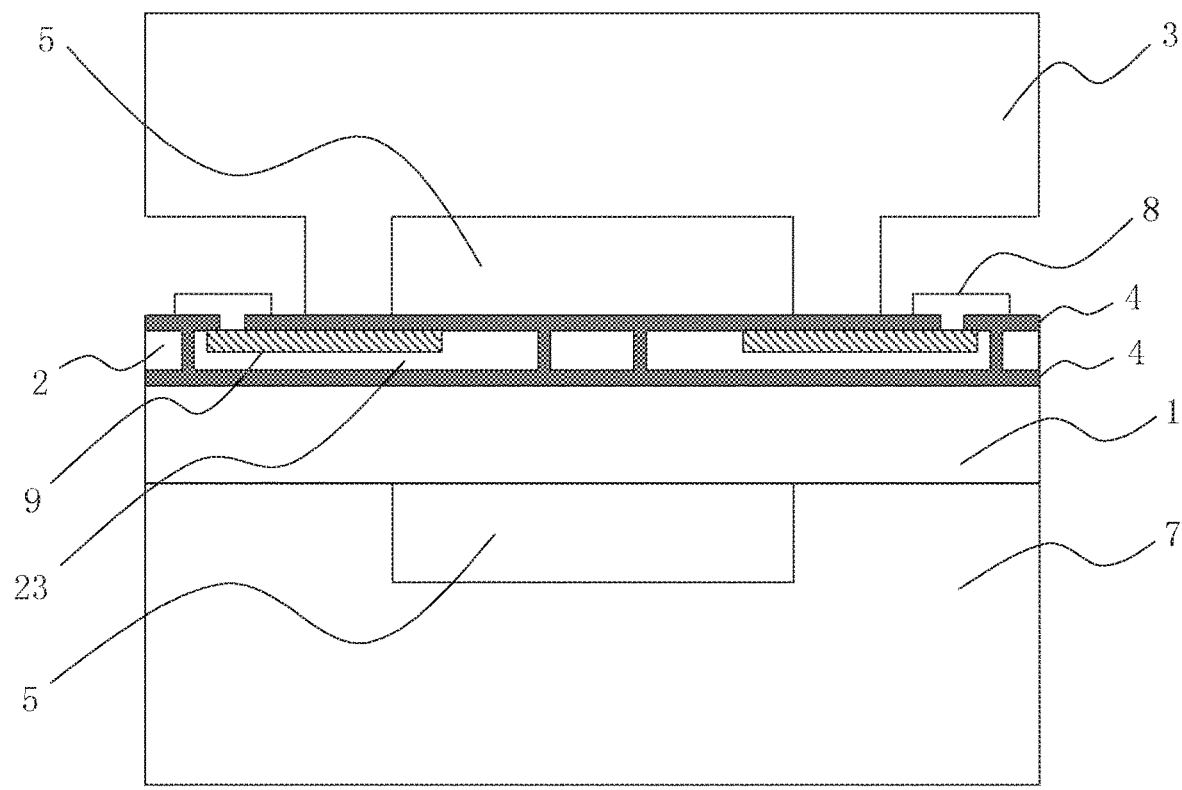
Figure 30:
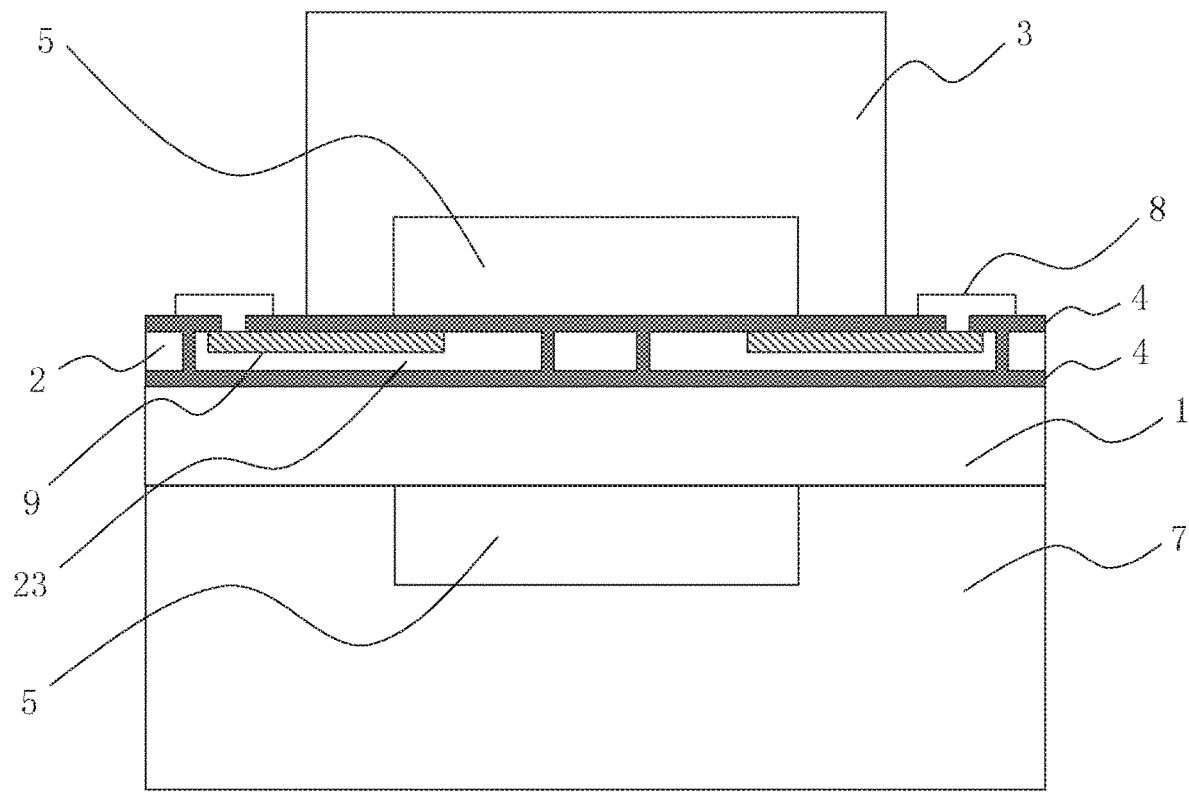
FIG. 30 is a cross-sectional view illustrating step 9 of the second fabrication process in the second embodiment of the pressure sensor die.

Summarizing all of the above, when applied to the critical (non-highly doped) portions of piezoresistive sensing elements 23, Equation (1) can be approximated by this simplified expression $$\Delta\rho_{11}/\rho \approx (\pi_{11}+\pi_{12})kP, \quad (2)$$

where k is a constant dependent on the shape and size of the dual cavities. Since electrical resistance is proportional to resistivity, from Equation (2), the electrical resistance changes in piezoresistive sensing elements 23 scale approximately linearly with the external pressure 39, whereas the pressure sensitivity is directly proportional to the piezoresistive coefficients $\pi_{11}+\pi_{12}$. However, since single crystalline silicon is anisotropic, $\pi_{11}+\pi_{12}$ will vary according to the orientations of plane 1-2 and direction 1 as well. For example, if plane 1-2 is a {110} crystallographic plane of silicon, with reference to FIG. 10, when direction 1 rotates from 0° to 360°, the piezoresistive coefficients $\pi_{11}+\pi_{12}$ will vary as shown in FIG. 10. Therefore on the {110} crystallographic plane of silicon, whether it is p-type or n-type silicon, $\pi_{11}+\pi_{12}$ will reach a maximum along the <110> direction and reach a minimum along the <100> direction orthogonal to <110>.

Figure 7:
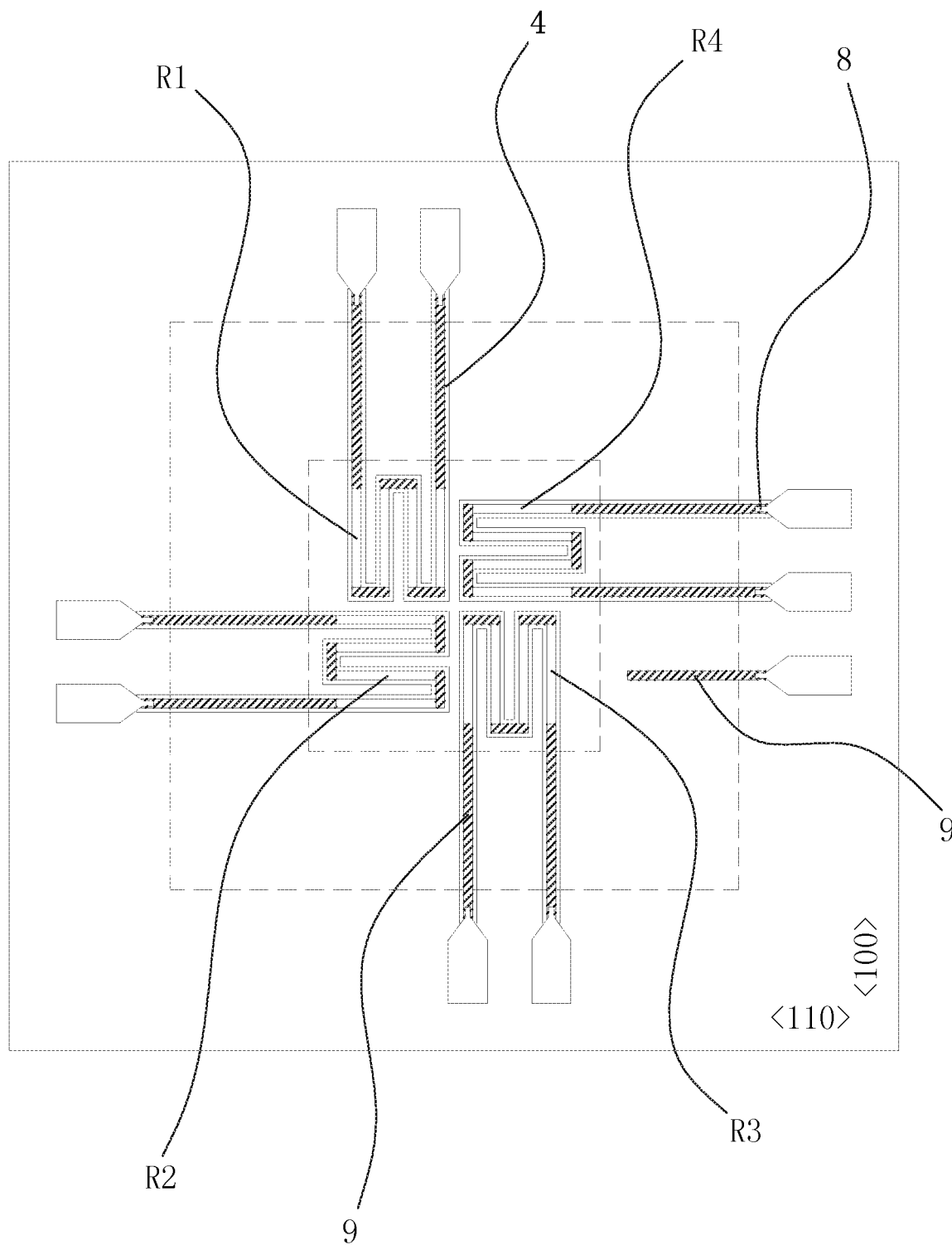
FIG. 7 is a plan view of the pressure sensor die in the second embodiment of this invention.

As described in the first and second embodiments of the pressure sensor die 31, preferably, the two sets of piezoresistive sensing elements R1, R3 and R2, R4 can be installed along different crystallographic orientations so that when the pressure sensor die 31 is uniformly compressed and deforms freely under the external pressure 39, the difference in piezoresistance effect between the two sets of piezoresistive sensing elements R1, R3 and R2, R4, i.e., the difference in the piezoresistive coefficients $\pi_{11}+\pi_{12}$ is maximized. This way, the electrical resistance change will be different and a voltage output will appear at the Wheatstone bridge. Preferably, the substrate 6 in the first embodiment and the device layer 2 in the second embodiment are formed on a {110} crystallographic plane of single crystalline silicon, and the two sets of piezoresistive sensing elements are respectively oriented along the orthogonal <100> and <110> crystallographic directions. With reference to FIGS. 3 and 7, the non-highly doped portions of piezoresistive sensing elements R1 and R3 are both oriented along the <100> direction. Therefore their electrical resistance changes are the same. Likewise, the non-highly doped portions of piezoresistive sensing elements R2 and R4 are both oriented along the <110> direction. Therefore their electrical resistance changes are the same as well but differ by the maximum amount from the electrical resistance changes of R1 and R3. Other crystallographic orientations of substrate 6 and piezoresistive sensing elements 23 are also feasible, e.g., by referring to Y. Kanda's description.

Summarizing the dual-cavity structure of the present invention, the main function of the upper sealed cavity is to provide a planar biaxial stress environment for the piezoresistive sensing elements 23, thereby fully utilizing the anisotropy of the piezoresistance effect of single crystalline silicon and increasing the sensitivity of the pressure sensor die. If the upper sealed cavity does not exist, the piezoresistive sensing elements 23 will be situated in a three-dimensional hydrostatic pressure environment, and the resulting sensitivity of the pressure sensor die will become very low. The lower sealed cavity is also critical. If the lower sealed cavity does not exist, when substrate 6 and cap 3 are compressed by the external high pressure, substrate 6 will bulge toward the upper sealed cavity. This will give rise to a tension on the surface region of the substrate where the main portion of the piezoresistive sensing elements 23 is located. This tension counteracts a portion of the bulk compression, with the result that the normal stresses σ11 and σ22 are both less than P, and the k in Equation (2) will be less than one. For example, an external pressure of 200 MPa may only induce a stress of about 120 MPa to act on the main portion of the piezoresistive sensing elements 23, resulting in a decrease in the sensitivity of the piezoresistive sensing elements. The symmetrical design of the dual cavities in the present invention ensures that under the external pressure, the substrate 6 does not bulge toward the upper sealed cavity. As a result, only bulk compression occurs, and the stress induced by the external pressure is not cancelled. At the same time, the portion of the substrate 6 in between the upper and lower sealed cavities becomes a main support for the entire pressure sensor die resisting the external pressure, which serves to amplify the stress. The thinner the substrate 6 is, the larger the σ11 and σ22 are in relation to P, resulting in k generally greater than one. For example, the same pressure of 200 MPa can now induce a stress of about 220 MPa to act on the main portion of the piezoresistive sensing elements 23, and the sensitivity of the pressure sensor die is thus greatly increased.

In a conventional silicon MEMS diaphragm-type pressure sensor die, the piezoresistive sensing elements are used to measure the maximum surface stress on the edge of the silicon diaphragm. Since the diaphragm is rather thin (typically less than 20 micrometers), the surface stress induced by the external pressure varies substantially with positions and depths on the diaphragm edge. Therefore a slight deviation in the position and depth of the piezoresistive sensing elements due to fabrication processing will lead to a large deviation in the stress being measured. In contrast, the present invention adopts a non-diaphragm structure to convert the external pressure into bulk stress inside the substrate. The thickness of the substrate is about 200 micrometers, and the variation in bulk stress at different positions and depths of the substrate is relatively small. Therefore the effect of a slight deviation on the piezoresistive sensing elements due to fabrication processing is also relatively small.

Furthermore, in a conventional silicon MEMS diaphragm-type pressure sensor die, the pressure signal is detected by two pairs of piezoresistive sensing elements oriented along the same direction. Due to the geometric constraints on placing electrical leads at the diaphragm edge, the shape and design of the two pairs of piezoresistive sensing elements often cannot be made identical. This can give rise to a mismatch in the electrical resistance values or in the temperature coefficients of resistance between the two pairs, resulting in an incomplete cancellation of common mode errors after processing through the Wheatstone bridge. Although this residual error can be further corrected via analog or digital compensation, some pressure accuracy is inevitably sacrificed. In contrast, the present invention employs two identical pairs of orthogonal and symmetrical piezoresistive sensing elements to measure the bulk stress along two dimensions and then obtain their differential output. Hence the pressure accuracy can be higher.

Next, the fabrication process for the pressure sensor die is described. The pressure sensor die comprises three parts: a cap, a substrate and a base. The upper and lower sealed cavities do not communicate with each other. This way the substrate does not contain any fine, fragile or movable mechanical structure. The whole fabrication process is relatively simple and the cost is comparatively low. Fabrication can be performed in the order of substrate→cap/substrate→cap/substrate/base, or
base→substrate/base→cap/substrate/base.

Alternatively, the substrate and the base can be separately fabricated and then bonded one by one. The starting material for substrate 6 can be a single crystalline silicon wafer or a silicon-on-insulator wafer. With reference to FIGS. 11 to 15, the first fabrication process for the first embodiment of the pressure sensor die is described. The starting material for substrate 6 is a single crystalline silicon wafer. This is followed by additional process steps as described in below.

Step 1, form a layer of silicon oxide 4 on the top surface of the substrate silicon wafer by means of the thermal oxidation or chemical vapor deposition method.

Step 2, using photolithography, first coat a layer of photoresist on the top surface of the substrate silicon wafer. Then expose the top surface according to certain mask pattern. The exposed photoresist is then dissolved away with a developer, leaving the unexposed photoresist which is subsequently hard baked. This way the exposed pattern will appear. Then using ion implantation and via energy control, the areas not covered by photoresist are implanted with a dopant ion with sufficient energy to penetrate the top silicon oxide layer reaching the substrate silicon wafer. Meanwhile, the ions are stopped by the photoresist in the covered areas. This way, selective regions on the substrate silicon wafer are implanted, forming piezoresistive sensing elements 23 with a dopant species of the opposite type to substrate 6. If the substrate 6 is of p-type, then an n-type dopant, such as phosphorus ion, can be used. If the substrate 6 is of n-type, then a p-type dopant, such as boron ion, can be used. Lastly, the photoresist is removed. In addition to the ion implantation method, the dopant can also be selectively introduced by a high temperature diffusion technique.

Step 3, using photolithography and ion implantation, form type-A highly doped regions 9 on the top surface of the substrate silicon wafer with a dopant species of the same type as piezoresistive sensing elements 23, thus forming highly conductive regions in which the electrical resistance is greatly reduced. If the substrate 6 is of p-type, then an n-type dopant, such as phosphorus ion, can be used. If the substrate 6 is of n-type, then a p-type dopant, such as boron ion, can be used.

Step 4, using photolithography and ion implantation, form type-B highly doped regions 10 on the top surface of the substrate silicon wafer with a dopant species of the same type as substrate 6, thus forming highly conductive regions in which the electrical resistance is greatly reduced. If the substrate 6 is of p-type, then a p-type dopant, such as boron ion, can be used. If the substrate 6 is of n-type, then an n-type dopant, such as phosphorus ion, can be used. Afterward form a silicon oxide layer 4 on the top surface of the substrate silicon wafer by means of the thermal oxidation or chemical vapor deposition method and activate all the implanted dopant species.

Step 5, using photolithography followed by reactive ion or plasma dry etching, or hydrofluoric acid etching, etch contact holes 8 through the silicon oxide layer 4 on top of the highly conductive regions, thereby reaching type-A and type-B highly doped regions on substrate 6. Afterward deposit metal inside contact holes 8 and on the entire silicon wafer. Using photolithography and etching, form metal interconnection patterns from contact holes 8.

Step 6, bond a cap silicon wafer which has been prefabricated with recesses to the top surface of the substrate silicon wafer in vacuum to form the vacuum sealed cavity. The bonding technique includes silicon fusion bonding, eutectic bonding, solder bonding, glass frit bonding, anodic bonding, or other thermal compression bonding methods.

Step 7, grind and thin down the bottom side of the bonded cap and substrate silicon wafers.

Step 8, bond a base silicon wafer 7 which has been prefabricated with recesses to the bottom surface of the bonded cap and substrate silicon wafers in vacuum to form the vacuum sealed cavity. The bonding technique includes silicon fusion bonding, eutectic bonding, solder bonding, glass frit bonding, anodic bonding, or other thermal compression bonding methods.

Step 9, using wafer dicing, cut the bonded cap, substrate and base silicon wafers into completed pressure sensor dice.

Next, the second fabrication process for the first embodiment of the pressure sensor die is described with reference to FIGS. 16 to 20. The starting material for substrate 6 is a single crystalline silicon wafer. This is followed by additional process steps as described in below.

Step 1, fabricate recesses 5 on the top surface of a base silicon wafer 7.

Step 2, bond the base silicon wafer 7 which has been prefabricated with recesses to the bottom surface of the substrate silicon wafer in vacuum to form the vacuum sealed cavity. The bonding technique includes silicon fusion bonding, eutectic bonding, solder bonding, glass frit bonding, anodic bonding, or other thermal compression bonding methods. Afterward grind and thin down the top side of the bonded substrate and base silicon wafers.

Step 3, form a layer of silicon oxide 4 on the top surface of the bonded substrate and base silicon wafers by means of the thermal oxidation or chemical vapor deposition method.

Step 4, using photolithography, first coat a layer of photoresist on the top surface of the bonded substrate and base silicon wafers. Then expose the top surface according to certain mask pattern. The exposed photoresist is then dissolved away with a developer, leaving the unexposed photoresist which is subsequently hard baked. This way the exposed pattern will appear. Then using ion implantation and via energy control, the areas not covered by photoresist are implanted with a dopant ion with sufficient energy to penetrate the top silicon oxide layer reaching the substrate silicon wafer. Meanwhile, the ions are stopped by the photoresist in the covered areas. This way, selective regions on the bonded substrate and base silicon wafers are implanted, forming piezoresistive sensing elements 23 with a dopant species of the opposite type to substrate 6. If the substrate 6 is of p-type, then an n-type dopant, such as phosphorus ion, can be used. If the substrate 6 is of n-type, then a p-type dopant, such as boron ion, can be used. Lastly, the photoresist is removed. In addition to the ion implantation method, the dopant can also be selectively introduced by a high temperature diffusion technique.

Step 5, using photolithography and ion implantation, form type-A highly doped regions 9 on the top surface of the bonded substrate and base silicon wafers with a dopant species of the same type as piezoresistive sensing elements 23, thus forming highly conductive regions in which the electrical resistance is greatly reduced. If the substrate 6 is of p-type, then an n-type dopant, such as phosphorus ion, can be used. If the substrate 6 is of n-type, then a p-type dopant, such as boron ion, can be used.

Step 6, using photolithography and ion implantation, form type-B highly doped regions 10 on the top surface of the bonded substrate and base silicon wafers with a dopant species of the same type as substrate 6, thus forming highly conductive regions in which the electrical resistance is greatly reduced. If the substrate 6 is of p-type, then a p-type dopant, such as boron ion, can be used. If the substrate 6 is of n-type, then an n-type dopant, such as phosphorus ion, can be used. Afterward form a silicon oxide layer 4 on the top surface of the bonded substrate and base silicon wafers by means of the thermal oxidation or chemical vapor deposition method and activate all the implanted dopant species.

Step 7, using photolithography followed by reactive ion or plasma dry etching, or hydrofluoric acid etching, etch contact holes 8 through the silicon oxide layer 4 on top of the highly conductive regions, thereby reaching type-A and type-B highly doped regions on substrate 6. Afterward deposit metal inside contact holes 8 and on the entire silicon wafer. Using photolithography and etching, form metal interconnection patterns from contact holes 8.

Step 8, bond a cap silicon wafer which has been prefabricated with recesses to the top surface of the bonded substrate and base silicon wafers in vacuum to form the vacuum sealed cavity. The bonding technique includes silicon fusion bonding, eutectic bonding, solder bonding, glass frit bonding, anodic bonding, or other thermal compression bonding methods.

Step 9, using wafer dicing, cut the bonded cap, substrate and base silicon wafers into completed pressure sensor dice.

Next, the first fabrication process for the second embodiment of the pressure sensor die is described with reference to FIGS. 21 to 25. The starting material for substrate 6 is a silicon-on-insulator wafer that comprises a handle layer 1, device layer 2, and a buried silicon oxide layer 4 formed between the handle layer and the device layer. This is followed by additional process steps as described in below.

Step 1, form a layer of silicon oxide 4 on the top surface of the substrate silicon wafer by means of the thermal oxidation or chemical vapor deposition method.

Step 2, using photolithography, first coat a layer of photoresist on the top surface of the substrate silicon wafer. Then expose the top surface according to certain mask pattern. The exposed photoresist is then dissolved away with a developer, leaving the unexposed photoresist which is subsequently hard baked. This way the exposed pattern will appear. Then using ion implantation and via energy control, the areas not covered by photoresist are implanted with a dopant ion with sufficient energy to penetrate the top silicon oxide layer reaching the substrate silicon wafer. Meanwhile, the ions are stopped by the photoresist in the covered areas. This way, selective regions on the device layer 2 of the substrate silicon wafer are implanted, forming type-A highly doped regions 9 with a dopant species of the same type as device layer 2, where the electrical resistance is greatly reduced thus forming highly conductive regions. If the device layer 2 is of p-type, then a p-type dopant, such as boron ion, can be used. If the device layer 2 is of n-type, then an n-type dopant, such as phosphorus ion, can be used. Lastly, the photoresist is removed. In addition to the ion implantation method, the dopant can also be selectively introduced by a high temperature diffusion technique.

Step 3, using photolithography on the substrate silicon wafer, followed by reactive ion or plasma dry etching, or hydrofluoric acid etching, selectively etch the top silicon oxide layer 4 to form trenches 11 reaching down to device layer 2. Afterward further etch trenches 11 from device layer 2 down to buried silicon oxide layer 4 using deep reactive ion etching or other dry or wet etching methods to form piezoresistive sensing elements 23.

Step 4, use the thermal oxidation or chemical vapor deposition method to form a silicon oxide layer 4 that fills trenches 11 and activate all implanted dopant species. As a result, the piezoresistive sensing elements 23 are completely wrapped around by a layer of silicon oxide insulation.

Step 5, using photolithography followed by reactive ion or plasma dry etching, or hydrofluoric acid etching, etch contact holes 8 through the silicon oxide layer 4 on top of the highly conductive regions, thereby reaching type-A highly doped regions on device layer 2. Afterward deposit metal inside contact holes 8 and on the entire silicon wafer. Using photolithography and etching, form metal interconnection patterns from contact holes 8.

Step 6, bond a cap silicon wafer which has been prefabricated with recesses to the top surface of the substrate silicon wafer in vacuum to form the vacuum sealed cavity. The bonding technique includes silicon fusion bonding, eutectic bonding, solder bonding, glass frit bonding, anodic bonding, or other thermal compression bonding methods.

Step 7, grind and thin down the bottom side of the bonded cap and substrate silicon wafers.

Step 8, bond a base silicon wafer 7 which has been prefabricated with recesses to the bottom surface of the bonded cap and substrate silicon wafers in vacuum to form the vacuum sealed cavity. The bonding technique includes silicon fusion bonding, eutectic bonding, solder bonding, glass frit bonding, anodic bonding, or other thermal compression bonding methods.

Step 9, using wafer dicing, cut the bonded cap, substrate and base silicon wafers into completed pressure sensor dice.

Next, the second fabrication process for the second embodiment of the pressure sensor die is described with reference to FIGS. 25 to 30. The starting material for substrate 6 is a silicon-on-insulator wafer that comprises a handle layer 1, device layer 2, and a buried silicon oxide layer 4 formed between the handle layer and the device layer. This is followed by additional process steps as described in below.

Step 1, fabricate recesses 5 on the top surface of a base silicon wafer 7.

Step 2, grind and thin down the bottom side of the handle layer 1 of the substrate silicon wafer. Then bond the base silicon wafer which has been prefabricated with recesses to the bottom surface of the substrate silicon wafer in vacuum to form the vacuum sealed cavity. The bonding technique includes silicon fusion bonding, eutectic bonding, solder bonding, glass frit bonding, anodic bonding, or other thermal compression bonding methods.

Step 3, form a layer of silicon oxide 4 on the top surface of the bonded base and substrate silicon wafers by means of the thermal oxidation or chemical vapor deposition method.

Step 4, using photolithography, first coat a layer of photoresist on the top surface of the bonded base and substrate silicon wafers. Then expose the top surface according to certain mask pattern. The exposed photoresist is then dissolved away with a developer, leaving the unexposed photoresist which is subsequently hard baked. This way the exposed pattern will appear. Then using ion implantation and via energy control, the areas not covered by photoresist are implanted with a dopant ion with sufficient energy to penetrate the top silicon oxide layer reaching the substrate silicon wafer. Meanwhile, the ions are stopped by the photoresist in the covered areas. This way, selective regions on the device layer 2 of the substrate silicon wafer are implanted, forming type-A highly doped regions 9 with a dopant species of the same type as device layer 2, where the electrical resistance is greatly reduced thus forming highly conductive regions. If the device layer 2 is of p-type, then a p-type dopant, such as boron ion, can be used. If the device layer 2 is of n-type, then an n-type dopant, such as phosphorus ion, can be used. Lastly, the photoresist is removed. In addition to the ion implantation method, the dopant can also be selectively introduced by a high temperature diffusion technique.

Step 5, using photolithography on the bonded base and substrate silicon wafers, followed by reactive ion or plasma dry etching, or hydrofluoric acid etching, selectively etch the top silicon oxide layer 4 to form trenches 11 reaching down to device layer 2. Afterward further etch trenches 11 from device layer 2 down to buried silicon oxide layer 4 using deep reactive ion etching or other dry or wet etching methods to form piezoresistive sensing elements 23.

Step 6, use the thermal oxidation or chemical vapor deposition method to form a silicon oxide layer 4 that fills trenches 11 and activate all implanted dopant species. As a result, the piezoresistive sensing elements 23 are completely wrapped around by a layer of silicon oxide insulation.

Step 7, using photolithography followed by reactive ion or plasma dry etching, or hydrofluoric acid etching, etch contact holes 8 through the silicon oxide layer 4 on top of the highly conductive regions, thereby reaching type-A highly doped regions on device layer 2. Afterward deposit metal inside contact holes 8 and on the entire silicon wafer. Using photolithography and etching, form metal interconnection patterns from contact holes 8.

Step 8, bond a cap silicon wafer which has been prefabricated with recesses to the top surface of the bonded base and substrate silicon wafers in vacuum to form the vacuum sealed cavity. The bonding technique includes silicon fusion bonding, eutectic bonding, solder bonding, glass frit bonding, anodic bonding, or other thermal compression bonding methods.

Step 9, using wafer dicing, cut the bonded cap, substrate and base silicon wafers into completed pressure sensor dice.

In the four fabrication processes described above, the fabrication process for the recesses on the cap silicon cap wafer comprises photolithography and etching.

The fabrication process for the recesses on the base silicon cap wafer comprises photolithography and etching.

The etching methods are selected from one or more of the following methods: dry etching or wet etching; the dry etching for silicon comprises deep reactive ion etching, reactive ion etching, and gaseous xenon difluoride etching; and the dry etching for silicon oxide comprises reactive ion etching, plasma etching, and hydrofluoric acid vapor etching.

The wet etching of silicon comprises one kind or a combination of the following etchants: potassium hydroxide, tetramethylammonium hydroxide or ethylenediamine pyrocatechol.

The wet etching of silicon oxide comprises one kind or a combination of the following etchants: hydrofluoric acid or buffered hydrofluoric acid.

The pressure sensor die in the present invention utilizes a non-diaphragm-type novel structure. The sensor die is uniformly compressed, and via the dual-cavity structure, the external pressure is converted into bulk stresses inside the substrate of the sensor die. Then, the bulk stresses are converted into electrical resistance changes in the piezoresistive sensing elements 23 via the silicon piezoresistance effect. The anisotropy of silicon piezoresistance is further exploited for the optimal placement of two sets of piezoresistive sensing elements 23 on the same crystallographic plane but along two different crystallographic orientations such that the difference in the electrical resistance changes between the two sets is maximized, thus enabling the measurement of pressure up to 200 MPa. Furthermore, the biaxial bulk stress induced by the external pressure is measured by two identical pairs of orthogonal and symmetrical piezoresistive sensing elements, which improves accuracy. In addition, the critical portions of piezoresistive sensing elements 23 are placed inside a vacuum sealed cavity. This reduces the undesirable influence from the external environment and foreign materials, and increases the reliability and accuracy of the pressure sensor. Moreover, in one of the preferred embodiments, each piezoresistive sensing element 23 is completely wrapped around and isolated by a layer of silicon oxide insulator 4. Such dielectric isolation scheme enables the present pressure sensor to operate at high temperature. Furthermore, connecting the piezoresistive sensing elements in a Wheatstone bridge configuration is the key to reduce common-mode errors and temperature effects. Finally, manufacturing the pressure sensor die on a silicon wafer using microfabrication techniques significantly reduces the manufacturing cost of the pressure sensor die. As described above, a single 8-inch silicon wafer can produce thousands to over 10,000 pressure sensor dice.

Lastly, it will be appreciated by those of ordinary skill in the art that many variations in the foregoing preferred embodiments are possible while remaining within the scope of the present invention. The present invention should thus not be considered limited to the preferred embodiments or the specific choices of materials, configurations, dimensions, applications or ranges of parameters employed therein.

The invention claimed is:

1. A pressure sensor die fabrication process comprising the following steps:

Step 1, grow or deposit a silicon oxide layer on the top surface of a substrate silicon wafer;

Step 2, using photolithography and ion implantation, dope selective regions on the top surface of said substrate silicon wafer, thus forming a plurality of piezoresistive sensing elements with the opposite dopant type to said substrate silicon wafer;

Step 3, using photolithography and ion implantation, highly dope selective regions on the top surface of said substrate silicon wafer, thus forming highly conductive regions with the opposite dopant type to said substrate silicon wafer;

Step 4, using photolithography and ion implantation, highly dope selective regions on the top surface of said substrate silicon wafer, thus forming highly conductive regions with the same dopant type as said substrate silicon wafer; afterward grow or deposit a silicon oxide layer on the top surface of said substrate silicon wafer; and activate said implanted dopant species in said piezoresistive sensing elements, said highly conductive regions with the opposite dopant type to said substrate silicon wafer, and said highly conductive regions with the same dopant type as said substrate silicon wafer;

Step 5, using photolithography and etching, etch contact holes through said silicon oxide layer over said highly conductive regions with the opposite dopant type to said substrate silicon wafer, and over said highly conductive regions with the same dopant type as said substrate silicon wafer; then use metal deposition to form metal interconnection patterns from said contact holes;

Step 6, bond a cap silicon wafer which has been prefabricated with recesses to the top surface of said substrate silicon wafer;

Step 7, grind and thin down the bottom side of said substrate silicon wafer;

Step 8, bond a base silicon wafer which has been prefabricated with recesses to the bottom surface of said substrate silicon wafer;

Step 9, using wafer dicing, cut said bonded cap silicon wafer, said substrate silicon wafer, and said base silicon wafer into completed individual pressure sensor dice.

2. The pressure sensor die fabrication process according to claim 1, wherein the fabrication process for said recesses on said cap silicon wafer and said base silicon wafer comprises photolithography and etching.

3. The pressure sensor die fabrication process according to claim 1, wherein said etching step comprises one kind or a combination of dry and wet etching methods; said dry etching method is selected from one or more of the following methods: deep reactive ion etching, reactive ion etching, or gaseous xenon difluoride etching for silicon; as well as reactive ion etching, plasma etching, or hydrofluoric acid vapor etching for silicon oxide.

4. The pressure sensor die fabrication process according to claim 1, wherein said etching step comprises a wet etching for silicon comprises one kind or a combination of the following etchants: potassium hydroxide, tetramethylammonium hydroxide, or ethylenediamine pyrocatechol.

5. The pressure sensor die fabrication process according to claim 3, wherein a wet etching method for silicon oxide comprises one kind or a combination of the following etchants: hydrofluoric acid or buffered hydrofluoric acid.

6. A pressure sensor die fabrication process comprising the following steps:

Step 1, fabricate recesses on the top surface of a base silicon wafer;

Step 2, bond said base silicon wafer to a bottom surface of a substrate silicon wafer; afterward grind and thin down a top side of said substrate silicon wafer;

Step 3, grow or deposit a silicon oxide layer on a top surface of said substrate silicon wafer;

Step 4, using photolithography and ion implantation, dope selective regions on the top surface of said substrate silicon wafer, thus forming a plurality of piezoresistive sensing elements with the opposite dopant type to said substrate silicon wafer;

Step 5, using photolithography and ion implantation, highly dope selective regions on the top surface of said substrate silicon wafer, thus forming highly conductive regions with the opposite dopant type to said substrate silicon wafer;

Step 6, using photolithography and ion implantation, highly dope selective regions on the top surface of said substrate silicon wafer, thus forming highly conductive regions with the same dopant type as said substrate silicon wafer; afterward grow or deposit a silicon oxide layer on the top surface of said substrate silicon wafer; and activate said implanted dopant species in said piezoresistive sensing elements, said highly conductive regions with the opposite dopant type to said substrate silicon wafer, and said highly conductive regions with the same dopant type as said substrate silicon wafer;

Step 7, using photolithography and etching, etch contact holes through said silicon oxide layer over said highly conductive regions with the opposite dopant type to said substrate silicon wafer, and over said highly conductive regions with the same dopant type as said substrate silicon wafer; then use metal deposition to form metal interconnection patterns from said contact holes;

Step 8, bond a cap silicon wafer which has been prefabricated with recesses to the top surface of said substrate silicon wafer;

Step 9, using wafer dicing, cut said bonded cap silicon wafer, said substrate silicon wafer, and said base silicon wafer into completed individual pressure sensor dice.

7. A pressure sensor die fabrication process, wherein a substrate uses a silicon-on-insulator wafer comprising a handle layer, a device layer, and a buried silicon oxide layer formed between said handle layer and device layer; said fabrication process comprising the following steps:

Step 1, grow or deposit a silicon oxide layer on a top surface of said device layer;

Step 2, using photolithography and ion implantation, highly dope selective regions on the top surface of said device layer, thus forming highly conductive regions with the same dopant type as said device layer;

Step 3, using photolithography and etching, etch trenches through said device layer reaching said buried silicon oxide layer, thus forming a plurality of piezoresistive sensing elements;

Step 4, grow or deposit a layer of silicon oxide to fill said trenches, and activate implanted dopant species in said ion implantation step in said highly conductive regions;

Step 5, using photolithography and etching, etch contact holes through said silicon oxide layer over said highly conductive regions reaching said highly conductive regions in said device layer; then use metal deposition to form metal interconnection patterns from said contact holes;

Step 6, bond a silicon cap wafer which has been prefabricated with recesses to a top surface of said substrate;

Step 7, grind and thin down the bottom side of said substrate;

Step 8, bond a base silicon wafer which has been prefabricated with recesses to the bottom surface of said substrate;

Step 9, using wafer dicing, cut said bonded silicon cap wafer, said substrate, and said base silicon wafer into completed individual pressure sensor dice.

8. A pressure sensor die fabrication process, wherein a substrate uses a silicon-on-insulator wafer comprising a handle layer, a device layer, and a buried silicon oxide layer formed between said handle layer and device layer; said fabrication process comprising the following steps:

Step 1, fabricate recesses on a top surface of a base silicon wafer;

Step 2, grind and thin down a bottom side of said substrate; afterward bond said base silicon wafer to a bottom surface of said substrate;

Step 3, grow or deposit a silicon oxide layer on a top surface of said device layer on said bonded substrate and base silicon wafer;

Step 4, using photolithography and ion implantation, highly dope selective regions on the top surface of said device layer, thus forming highly conductive regions with the same dopant type as said device layer;

Step 5, using photolithography and etching, etch trenches through said device layer reaching said buried silicon oxide layer, thus forming a plurality of piezoresistive sensing elements;

Step 6, grow or deposit a layer of silicon oxide to fill said trenches, and activate implanted dopant species in said ion implantation step in said highly conductive regions;

Step 7, using photolithography and etching, etch contact holes through said silicon oxide layer over said highly conductive regions reaching said highly conductive regions in said device layer; then use metal deposition to form metal interconnection patterns from said contact holes;

Step 8, bond a cap silicon wafer which has been prefabricated with recesses to the top surface of said substrate;

Step 9, using wafer dicing, cut said bonded cap silicon wafer, said substrate, and said base silicon wafer into completed individual pressure sensor dice.

* * * * *